United States Patent
Müller et al.

(10) Patent No.: US 7,577,408 B2
(45) Date of Patent: *Aug. 18, 2009

(54) METHOD FOR PREDISTORTION OF A SIGNAL, AND A TRANSMITTING DEVICE HAVING DIGITAL PREDISTORTION, IN PARTICULAR FOR MOBILE RADIO

(75) Inventors: Jan-Erik Müller, Ottobrunn (DE); Nazim Ceylan, München (DE)

(73) Assignee: Infineon Technologies, Munich (DE)

( * ) Notice: Subject to any disclaimer, the term of this patent is extended or adjusted under 35 U.S.C. 154(b) by 451 days.

This patent is subject to a terminal disclaimer.

(21) Appl. No.: 11/389,383

(22) Filed: Mar. 24, 2006

(65) Prior Publication Data
US 2006/0229036 A1 Oct. 12, 2006

(30) Foreign Application Priority Data
Mar. 24, 2005 (DE) .................. 10 2005 013 880

(51) Int. Cl.
*H04B 1/04* (2006.01)
(52) U.S. Cl. ............... 455/114.3; 455/127.1; 455/102; 455/127.2
(58) Field of Classification Search ............ 455/114.3, 455/127.1–127.5, 114.1–114.2; 375/296–297; 330/149
See application file for complete search history.

(56) References Cited

U.S. PATENT DOCUMENTS

| | | | |
|---|---|---|---|
| 4,291,277 A | 9/1981 | Davis et al. | |
| 5,113,414 A | 5/1992 | Karam et al. | |
| 5,748,678 A * | 5/1998 | Valentine et al. | 375/297 |
| 6,072,364 A | 6/2000 | Jeckeln et al. | |
| 6,275,685 B1 * | 8/2001 | Wessel et al. | 455/126 |
| 6,477,477 B1 | 11/2002 | Thron et al. | |

(Continued)

FOREIGN PATENT DOCUMENTS

DE 100 45 761 A1 3/2002

(Continued)

OTHER PUBLICATIONS

"Survey on PA-Linearisation and Efficiency Enhancement Methods", Nazim Ceylan, Oezhan Koca and Jan-Erik Müller, Mar. 10, 2003, 17 pgs.

(Continued)

*Primary Examiner*—Lana N Le
(74) *Attorney, Agent, or Firm*—Eschweiler & Associates, LLC

(57) ABSTRACT

A method is proposed for signal processing with predistortion. An amplifier circuit is provided for this purpose, whose operating states are characterized by at least one characteristic variable. A digital modulation signal having two components (R, φ), as well as a power word (LS), derived from the first component (R), are produced, and an operating state of the at least one amplifier circuit is then determined by recording of the characteristic variable. The power word (LS) is compared with the reference value and used to decide whether to predistort the first and/or the second component. A table with various predistortion coefficients is selected from at least two tables, depending on the operating state of the amplifier circuit. One predistortion coefficient is then determined from the selected table with the produced power word (LS) and the first component (R), and the predistortion coefficient is used for predistortion.

28 Claims, 15 Drawing Sheets

U.S. PATENT DOCUMENTS

| | | | |
|---|---|---|---|
| 6,587,514 B1* | 7/2003 | Wright et al. | 375/296 |
| 7,170,342 B2* | 1/2007 | Suzuki et al. | 330/149 |
| 7,295,815 B1* | 11/2007 | Wright et al. | 455/91 |
| 2002/0050372 A1 | 5/2002 | Lee | |
| 2002/0190787 A1* | 12/2002 | Kim et al. | 330/2 |
| 2003/0035494 A1 | 2/2003 | Bauder et al. | |
| 2004/0142667 A1* | 7/2004 | Lochhead et al. | 455/114.3 |
| 2004/0208157 A1 | 10/2004 | Sander et al. | |
| 2005/0079834 A1* | 4/2005 | Maniwa et al. | 455/114.3 |
| 2005/0195919 A1* | 9/2005 | Cova | 375/297 |
| 2006/0226903 A1* | 10/2006 | Muller et al. | 330/149 |
| 2008/0063113 A1* | 3/2008 | Gao et al. | 455/114.3 |

FOREIGN PATENT DOCUMENTS

| | | |
|---|---|---|
| DE | 10 2004 019 984 A1 | 11/2005 |
| WO | WO 97/30521 A1 | 8/1997 |

OTHER PUBLICATIONS

"Optimization of EDGE Terminal Power Amplifiers Using Memoryless Digital Predistortion", Nazim Ceylan et al., RFIC Special Issue of the MTT Transactions, 2005, 9 pgs.

"Mobile Phone Power Amplifier Linearity and Efficiency Enhancement Using Digital Predistortion", N. Ceylan, J.E. Mueller, T. Pittorino and R. Weigel, To be Submitted to the 33$^{rd}$ European Microwave Conference, 3 pgs., Oct. 7-9, 2003.

"Comparison of Different Adaptation Algorithms for Adaptive Digital Predistortion Based on EDGE Standard", Kok Chew Lee and Peter Gardner, IEEE MTT-S International Microwave Symposium Digest, 2001, pp. 1353-1356.

"Adaptive Linearization Using Predistortion-Experimental Results", Michael Faulkner and Mats Johansson, IEEE Transactions on Vehicular Technology, vol. 43, No. 2, May. 1994, pp. 323-332.

"A DSP Controlled Adaptive Feedforward Amplifier Linearizer", Stephen J. Grant, James K. Cavers and Paul A. Goud, 5$^{th}$ IEEE international Conference on Universal Personal Communications, 1996, pp. 788-791.

"High Efficiency and High Linearity InGaP/GaAs HBT Power Amplifiers: Matching Techniques of Source and Load Impedance to Improve Phase Distortion and Linearity", Taisuke Iwai, Shiro Ohara, Hiroshi Yamada, Yasuhiro Yamaguchi, Kenji Imanishi and Kazukiyo Joshin, IEEE Transactions on Electronic Devices, vol. 45, No. 6, Jun. 1998, 5 pgs.

"High-Linearity RF Amplifier Design", Chapters 4, 5 & 6, P.B. Kenington, Artech House, Oct. 2000, 24 pgs.

"Amplifier Linearization Using a Digital Predistorter with Fast Adaptation and Low Memory Requirements", James K. Cavers, IEEE Transactions on Vehicular Technology, vol. 39, No. 4, Nov. 1990, pp. 374-382.

"Increasing Talk-Time with Efficient Linear PA's", Stephen Mann, Mark Beach, Paul Warr and Joe McGeehan, The Institution of Electrical Engineers, 2000, pp. 6/1-6/7.

"Digital Predistortion Techniques for RF Power Amplifiers with CDMA Applications", Frank Zavosh, Mike Thomas, Chris Thron, Tracy Hall, Daniel Artusi, David Anderson, David Ngo and David Runton, Microwave Journal, Oct. 1999, 9 pgs.

"L-Band Transmitter Using Kahn EER Technique", Frederick H. Raab, Bernard E. Sigmon, Ronald G. Myers and Robert M. Jackson, IEEE Transactions on Microwave Theory and Techniques, vol. 46, No. 12, Dec. 1998, pp. 2220-2225.

"Microwave Power Amplifiers with Digitally-Controlled Power Supply Voltage for High Efficiency and High Linearity", M. Ranjan, K.H. Koo, G. Hanington, C. Fallesen and P. Asbeck, IEEE MTT-S International Microwave Symposium Digest, 2000, 4 pgs.

"Effects of Anti-Aliasing Filters in Feedback Path of Adaptive Predistortion", Weiyun Shan and Lars Sundstrom, IEEE MTT-S International Microwave Symposium Digest, 2002, pp. 469-472.

"Effects of Reconstruction Filters in Digital Predistortion Linearizers for RF Power Amplifiers", Lars Sundstrom, Michael Faulkner and Mats Johansson, IEEE Transactions on Vehicular Technology, vol. 44, No. 1, Feb. 1995, pp. 131-139.

"A Complex Polynomial Predistorter Chip in CMOS for Baseband or IF Linearization of RF Power Amplifiers", E. Westesson and L. Sundstrom, IEEE International Symposium on Circuits and Systems, 1999, pp. I-206-I-209.

"A Novel Series Diode Linearizer for Mobile Radio Power Amplifiers", Kazuhisa Yamauchi, Kazutomi Mori, Masatoshi Nakayama, Yasushi Itoh, Yasuo Mitsui and Osami Ishida, IEEE MTT-S, 1996, pp. 831-834.

"Investigations of Linearity Characteristics for Large-Emitter Area GaAs HBT Power Stages", G.L. Madonna, M. Pfost, R. Schultheis and J.E. Mueller, GAAS 2001 Conference, London, 4 pgs.

\* cited by examiner

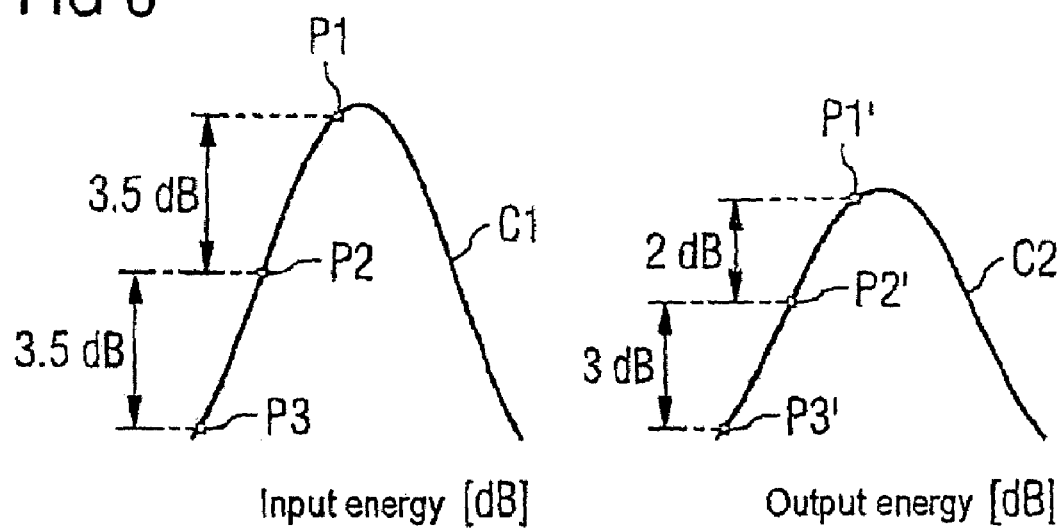

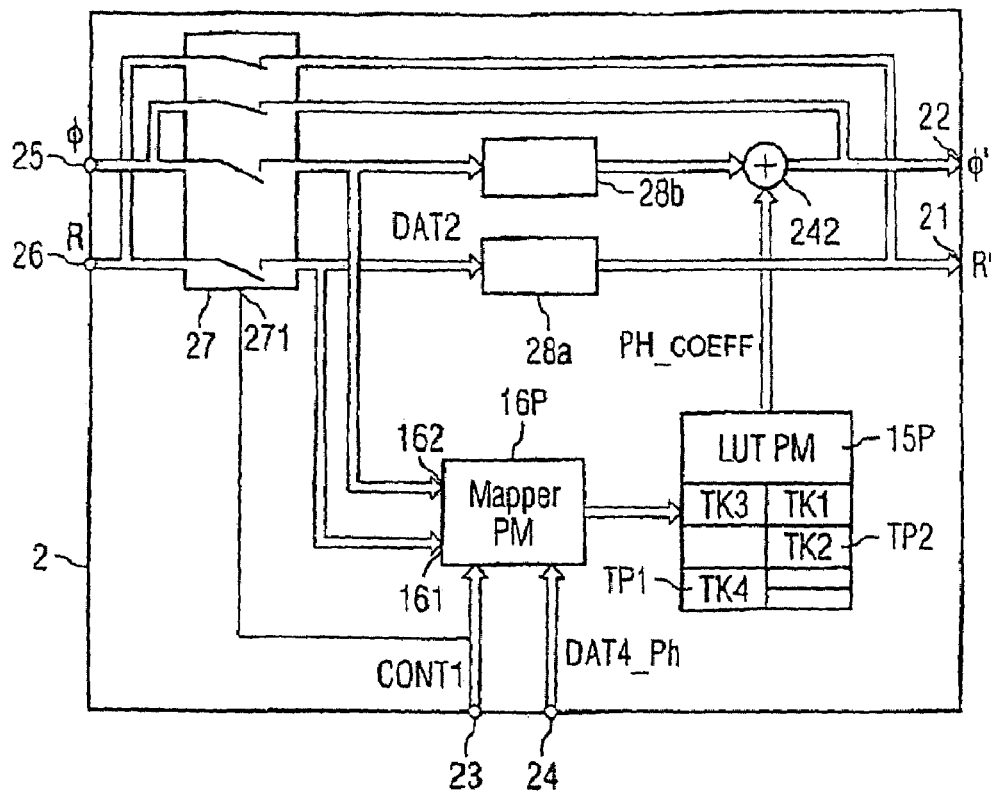
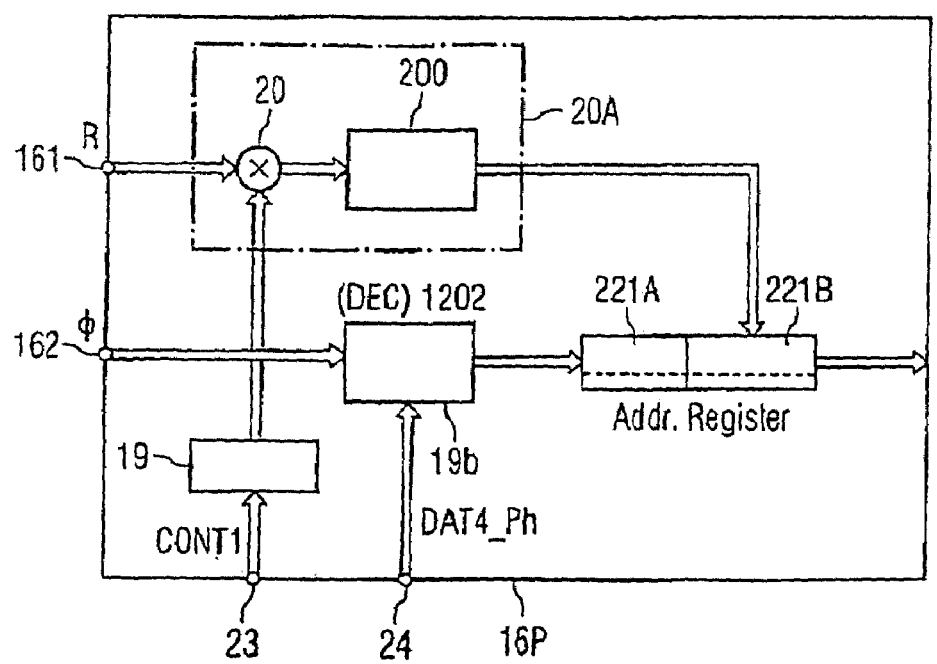

METHOD FOR PREDISTORTION OF A SIGNAL, AND A TRANSMITTING DEVICE HAVING DIGITAL PREDISTORTION, IN PARTICULAR FOR MOBILE RADIO

REFERENCE TO RELATED APPLICATIONS

This application claims the benefit of the priority date of German application DE 10 2005 013 880.2, filed on Mar. 24, 2005, the contents of which are herein incorporated by reference in their entirety.

FIELD OF THE INVENTION

The invention relates to a method for predistortion of a signal, and to a transmitting device with digital predistortion, for example, for mobile radio.

BACKGROUND OF THE INVENTION

The requirements for the signal quality of transmitting devices are becoming more stringent as the need for high data rates and increasing mobility grows. The modern mobile radio standards such as UMTS/WCDMA, GSM/EDGE, 802.11a, 802.11b, 802.11g or Bluetooth Medium Data Rate require special modulation types for data transmission, which modulate both the phase and the amplitude of a carrier signal at the same time. Simultaneous amplitude and phase modulation makes it possible to achieve higher data transmission rates and thus better bandwidth efficiency. The mobile radio standards mentioned above envisage, for example, the use of QPSK (Quadrature Phase Shift Keying, 8-PSK (8-Phase Shift Keying) or QAM (Quadrature, Amplifier, Modulation) as modulation types for the data transmission rate. Depending on the selected application for the individual mobile radio standards, these high-quality modulation types are used not only for data transmission from a base station to a mobile communication appliance but also from the mobile communication appliance to the base station.

The modulation types which are used for modern mobile radio standards are particularly sensitive to possible interference or distortion, which is produced by various components in the transmission path. Interference or distortion such as this in the transmission path leads to changes in the phase and amplitude of a carrier signal. This results in data errors in the transmitted signal.

In order to suppress the interference or distortion, it is necessary for the individual components in the transmission path to have a highly linear transmission characteristic or transmission response. In this example, the expression transmission characteristic linearity means the transmission response of an element within the transmission path, which essentially produces an output signal that is proportional to the input signal. Circuits whose transmission responses have non-linear areas produce an output signal which is not proportional to an input signal. This component characteristic, which is also referred to as non-linearity, can lead to data errors within the transmitted signal.

Typical circuit elements within the transmission path whose characteristic has non-linear areas are, in particular, the individual amplifiers in the transmission path which amplify the signal to be transmitted to the output power level. By way of example, in the example of power amplifiers, a high degree of linearity in their output signal is achieved by operating the power amplifiers considerably below their maximum achievable output power level. This is referred to as operation in the linear area of their characteristic. However, operation of the power amplifier in this way leads to a high quiescent current being drawn, thus increasing the overall power loss. The efficiency, which mainly indicates the ratio of the output power that is produced to the consumed power that is applied to the power amplifier, in consequence falls. Particularly in the example of mobile communication appliances, the greater current that is drawn in the power amplifiers reduces the operating time of the communication appliances, which is governed by the capacity of their rechargeable batteries.

In order to increase the efficiency of the individual power amplifiers, and thus of the overall transmitting device, it is expedient to operate the individual amplifiers and other active circuits in their maximum achievable power range. However, the transmission characteristics of the individual active switching elements have a very highly non-linear response in this range. In consequence, the output signal is considerably distorted, thus possibly inducing data transmission errors.

Modern mobile communication appliances normally attempt to reach a compromise between the current that is drawn and the linearity of the individual active switching elements in the transmission path. This can be achieved by suitable circuitry. By way of example, it is possible to reduce the current that is drawn by choice of suitable biasing, the adjustment of the operating points and by a suitable load impedance of the output of the components with a non-linear characteristic. The documents by G. L. Madonna et al.: "Investigations on Linearity characteristics for large-emitter area GaAs HBT power stages", GAAS 2001 conference, London 2001 and Iwai et al.: "High efficiency and high linearity InGaP/GaAs HBT power amplifiers: Matching techniques of source and load impedance to improve phase distortion and linearity" IEEE transaction on electronics devices, volume 45, No. 6, June 1998 disclose various examples for a method such as this. In order to further improve the transmission response of the overall transmission path and in order to reduce possible data errors, it is normal in modern transmitting devices to additionally predistort the input signal.

In the example of predistortion, an improvement in the signal quality is achieved by supplying a distorted signal to the amplifier, or to the component with the non-linear characteristic. The distortion is in this example chosen such that the distortion caused by the transmission response is accurately compensated for. It is then once again possible to tap off a signal which is approximately proportional to the input signal at the output of the amplifier or of the component with a non-linear characteristic.

The documents Yamauchi et al.: "A Novel Series Diode Linearizer for Mobile Radio Power Amplifiers", IEEE MTT-S 1996, pages 831 to 833 an E. Westesson et al.: "A Complex Polynomial Predistorted Chip in CMOS for Baseband or IF Linearization for RF Power Amplifiers", IEEE Internations Symposium of Circuits and Systems 1999, describe examples of predistortion within an analog signal processing chain in the transmitting device. Circuits for distortion of analog signals can be produced at particularly low cost by means of simple additional elements. However, external operating conditions, only some of which can be influenced, such as the temperature, drive level of the components and operating points of the individual circuits, may be varied only within narrow limits. Otherwise, additional readjustment of the predistortion circuit is required. Additional control circuits for predistortion of analog signals require additional space on a semiconductor body, and increase the current that is drawn. Furthermore, they lead to only moderate improvements in terms of the linearity of an output signal.

In contrast to this, predistortion of digital signals offers very good adaptability to changing external operating conditions. In this example, predistortion is carried out by a variation of the so-called digital baseband signals. In this example, even before conversion to an analog baseband signal or before modulation of a carrier signal, the baseband signal is changed in such a way as to compensate for the distortion caused by the circuits with a non-linear characteristic. In the example of so-called adaptive digital predistortion, a portion of the analog output signal is extracted downstream from the elements with a non-linear characteristic, is demodulated and is converted back to a digital baseband signal.

The distortion caused by the components with a non-linear characteristic within the transmission path can be determined from the comparison of the converted baseband signal with the original undistorted digital baseband signal. The documents U.S. Pat. Nos. 6,477,477 and 4,291,277 disclose examples of transmitting devices with adaptive digital predistortion. In the example of mobile communication appliances, which in particular are intended to cost little and are designed to be small and current-saving, this procedure is unattractive in some circumstances, since the computation complexity that is required in the digital area is relatively high.

SUMMARY OF THE INVENTION

The invention is directed to a method for predistortion of a signal, which can be implemented by simple means in a transmitting device and at the same time leads to a considerable current saving. The invention also includes a transmitting device whose current draw is less than that of known transmitting devices.

According to one embodiment, the method comprises providing at least one amplifier circuit which is designed to assume one operating state from a set of a first operating state and at least one second operating state, with the first operating state and the at least one second operating state being characterized by at least one characteristic variable.

A first and second modulation signal with a first component and a second component is provided, along with a first table which has a plurality of predistortion coefficients; and at least one second table which has a plurality of predistortion coefficients.

The method further comprises producing a power word derived from the first component signal that indicates a maximum value of the first component.

The operating state of the at least one amplifier circuit is determined and the power word is compared with a reference value to produce a first result or a second result depending on the comparison.

One table from the first and the at least one second table is selected depending on the determined operating state, and a predistortion coefficient is selected from the selected table depending on the power word that is produced and the first component when the comparison of the power word and a reference value has produced the first result.

Distortion of at least one component of the first component or of the second component with the predistortion coefficient is then performed when the comparison of the power word and a reference value has produced the first result.

The adaptive digital predistortion method proposed here is compatible with conventional transmission architectures in mobile communication appliances. The recording of the characteristic variable which characterizes the operating state of the at least one amplifier circuit, and the subsequent selection of a table with predistortion coefficients results in the best possible selection of the predistortion coefficients to be used. The predistortion coefficients which are stored in the tables are suitable for describing the non-linear transmission response of the at least one amplifier circuit in the respective operating state. The operating state is characterized by the at least one characteristic variable.

The determination of the characteristic variable thus results in determination of the operating state, and the suitable table of predistortion coefficients is then selected as a function thereof. This takes account of the fact that distortion of an output signal as a result of non-linear components depends inter alia on the amplitude of the input signal. According to the invention, a power word is therefore produced, which is derived from the first component of the modulation signal and indicates a value of the first component. This value may, for example, comprise a maximum value, an average value or a minimum value. Furthermore, the power word may also include other information, for example a crest factor.

The value which is contained in the power word is compared with a reference value, and a first or a second result is produced therefrom. Depending on this result, predistortion is carried out by selection of one of the two tables depending on the determined operating mode, and subsequent selection of a predistortion coefficient from the respectively selected table, depending on the power word and the first component.

Predistortion of at least one of the first or second components thus takes place only when the comparison of the power word with a reference value has produced a specific result. Otherwise, it is assumed that predistortion is not necessary, and that the linearity requirements of an output signal are compliant.

In this embodiment, it is advantageous that the method can be carried out without having to have detailed knowledge of the transmission characteristic and the behavior of the at least one amplifier circuit in the operating states. In fact, it is sufficient to determine at least one characteristic variable, by means of which the operating state of the amplifier circuit is characterized. The characteristic variable is recorded in a suitable manner by sample-like measurements of specific parameters.

In one advantageous embodiment, the operating mode is determined by measuring a temperature of the at least one amplifier circuit. Alternatively, a current draw or a supply voltage of the at least one amplifier circuit is determined. In another embodiment, the operating mode is determined by recording an impedance or an impedance change in the at least one amplifier circuit. In yet another embodiment, once again, a reflection coefficient is determined at a signal output of the at least one amplifier circuit.

The temperature, current draw, supply voltage, impedance or reflection coefficient each represent a characteristic variable whose values each characterize a first or at least one second operating state. Recording of the corresponding characteristic variables makes it possible to determine the operating state of the at least one amplifier circuit and, on the basis of the result, to select the suitable table which contains those coefficients which are most suitable for predistortion of the digital modulation signal in the current operating state of the at least one amplifier circuit.

In one embodiment of the method, the step of distortion of the at least one component comprises predistorting the first component. In such an example, the method includes: providing a carrier signal with a phase and an amplitude; modulating the phase of the carrier signal with the second component; modulating the amplitude of the carrier signal with the distorted first component when the comparison of the power word with the reference value has produced the first result, or with the first component when the comparison has produced the second result; and amplifying the carrier signal by the at least one amplifier circuit.

In another embodiment of the method, the at least one component in the distortion step represents the second component. The method may then include: providing a carrier signal with a phase and an amplitude; modulating the phase of the carrier signal with the distorted second component when the comparison of the power word with the reference value has produced the first result, or with the second component when the comparison has produced the second result; modulating the amplitude of the carrier signal with the first component; and amplifying the carrier signal by the at least one amplifier circuit.

In these two embodiments, only one of the two components of the first and second modulation signal is in each example amplified, when this appears to be necessary. The method can thus be carried out both separately for the first and for the second component. In this context, it is advantageous to in each example provide separate tables for the first and second components.

In one alternative embodiment of the method, each predistortion coefficient in the first and in the at least one second table comprises a first and a second coefficient element. If the comparison indicates that distortion of the digital modulation signal and of its components with predistortion coefficients is necessary, the first component of a discrete-value and a discrete-time modulation signal is predistorted with the first coefficient element. The second component is predistorted with the second coefficient element. The phase of the carrier signal is then modulated with the distorted second component. The distorted first component is likewise applied to the amplitude of the carrier signal. The carrier signal which has been modulated with the distorted components in this way is amplified by the at least one amplifier circuit.

In this embodiment it is, of course, also possible to provide two first tables as well as at least two second tables. The first tables from the first and at least one second table contain the predistortion coefficients for the first component. The respective second tables comprise the predistortion coefficients for the second component. Depending on the selected operating mode, in each example one first table and one second table with predistortion coefficients are selected for the first component and for the second component.

In another embodiment, a predistortion coefficient is selected from the selected table depending on the power word that is produced, the first component. In one embodiment of the invention, the selection of the table element depends on the power word and on the second component. The additional dependency on the second component is worthwhile in particular when the predistortion coefficient to be selected is used for distortion of the second component.

In a further embodiment, one table is selected from the first and from the at least one second table depending on the determined characteristic variable, the determined operating state and the first component. This selection is used to decide which table best describes the operating characteristics of the at least one power amplifier or of the components with a non-linear transmission characteristic. The predistortion coefficients in the table selected by means of this method are once again particularly suitable to compensate for the distortion in the at least one amplifier circuit. Alternatively, one table is selected from the first and the at least one second table depending on the determined operating mode and the second component. A table can thus be selected both purely from the determined operating mode as well as from the determined operating mode and the first or second component.

The additional dependency on the first or second component allows further characteristic variables and/or characteristics of the operating state of at least one amplifier circuit to be taken into account. This is particularly worthwhile when the table which is selected in this method step contains predistortion coefficients which are intended for distortion of the corresponding component of the discrete-value and discrete-time modulation signal.

In one alternative embodiment, a table is selected from the first and the at least one second table depending on the determined operating mode and the power word, and/or a maximum value of the first component.

It is desirable for the operating state of the at least one amplifier circuit be known as accurately as possible in order to select the suitable predistortion coefficients or the suitable table. In one embodiment of the invention, an operating state is determined by determining a temperature of the at least one amplifier circuit. The operating state of the at least one amplifier circuit is determined from the determined temperature, which represents the characteristic variable for characterization of the operating state. It is advantageous to associate one value of the at least one characteristic variable with each operating state. Alternatively, a range of a characteristic variable can in each example be associated with one operating state of the at least one amplifier circuit. This embodiment is particularly advantageous since this makes it possible to provide a plurality of value ranges of the characteristic variable, which respectively characterize the various operating states.

In another embodiment of the invention, the characteristic variable for characterization of the operating state of the at least one amplifier device is determined by recording a current drawn or by recording a supply voltage of the at least one amplifier circuit. In another embodiment, an impedance or an impedance change of the at least one amplifier circuit is determined. It is likewise possible to determine a reflection coefficient at a signal output of the at least one amplifier circuit. A characteristic variable which characterizes an operating state of the at least one amplifier circuit more accurately than will be possible if only one characteristic variable were to be determined can be derived by combination of a plurality of individual operating parameters, such as the temperature, the current draw, the supply voltage, the impedance or reflection coefficients.

Another possible way to determine the operating state is to evaluate a signal which is emitted from the at least one amplifier device. This has the particular advantage that further operating parameters which likewise affect the output signal need not be known or determined. It is sufficient to record various parameters of the output signal from the at least one amplifier circuit for determination of the operating state and determination of the characteristic variable.

In this embodiment, the operating state of the at least one amplifier circuit is determined by first providing a local oscillator signal. A signal element from the amplified signal that is emitted from the at least one amplifier circuit is then output. The frequency of the signal element is converted with the aid of the local oscillator signal, and is then subdivided into a third and a fourth component. The third and fourth components are used to form a control word, which essentially comprises the characteristic variable and is suitable for selection of one table from the first and at least one second table. In this embodiment, the characteristic variable for determination of the respective operating state is formed in the control word.

In another embodiment of the invention, the step of provision of the discrete-value and discrete-time modulation signal comprises: providing an in-phase component and of a quadrature component; producing the first component by formation of the square of the magnitude of the in-phase component and of the quadrature component; and producing the second component from the in-phase component and the quadrature component.

In this embodiment of the invention, the discrete-value and discrete-time modulation signal is formed by an in-phase component and a quadrature component. The first and the second components are then produced from them by first of all producing the magnitude of the in-phase component and of the quadrature component. This magnitude essentially represents the amplitude information of the digital modulation signal. The first component thus forms the amplitude elements of the discrete-value and discrete-time modulation element. At the same time, the second component is produced from the in-phase component and from the quadrature component as the phase element of the in-phase component and of the quadrature component.

In one example, this is advantageously done by use of a trigonometric function, for example by the application of an arc-sine function to the ratio of the in-phase component to the quadrature component. If, as is frequently the example in practice, the baseband unit is designed to emit the in-phase component and the quadrature component, the first component, which contains the amplitude element, and the second component, which contains the phase element, can easily be determined from this.

In another embodiment of the invention, a power level of the amplified carrier signal to be emitted during a time period is determined in the step of production of the power word. This power to be emitted represents the nominal power of the carrier signal, that is to say a desired average output power. A maximum of the first component is likewise determined during this time period, and is used to form the power word.

In modern communication systems, it is normal to determine the power of a carrier signal to be emitted during a time period, in advance. A signal processor accordingly knows a nominal power level to be emitted during this time period. Furthermore, data which is intended to be emitted during the time period is known. Since the data is coded in a digital modulation signal with a first component and a second component, a specific value of the amplitude of the digital modulation signal during this time period can be determined from this. The value may, for example, represent the maximum amplitude during this time period, an average power or else a minimum.

In one embodiment, the power word which is produced from the nominal power and the value indicates the information about the specific value of the amplitude of the discrete-value and discrete-time modulation signal during this time period, as well as the nominal power to be emitted. On the one hand, it is possible to use this to determine whether predistortion is necessary, while on the other hand the value of the first component in the power word is used to determine the required predistortion coefficients and/or the table.

In another embodiment of the invention, a memory having a large number of addressable memory cells is provided. These memory cells are suitable for storage of predistortion coefficients. For this purpose, the memory is subdivided into a first subarea and a second subarea. The predistortion coefficients for the first table are stored in the first subarea. Predistortion coefficients for the second table are stored in the second subarea.

By suitable choice of the addressing, it is thus possible in a simple manner to obtain predistortion coefficients from the first table and/or from the second table by addressing of the first area of the memory or of the second subarea of the memory. For this purpose, in one embodiment, a first address part is formed by evaluation of the determined operating mode. This first address part essentially addresses all of the predistortion coefficients in the first table or in the second table. A second address part, which selects a single predistortion coefficient from the table determined by the first address part, is formed from the first component and from a factor which is derived from the power word. Together with the second address part, the first address part produces a complete address of a predistortion coefficient in the memory. The predistortion coefficient which is associated with the address is determined from the combined first and second address parts.

In order to reduce the current that is drawn while at the same time complying with the linearity requirements for an output signal, a transmitting device, in particular for mobile radio, is provided. The transmitting device comprises a signal processing device which is designed to produce and emit a discrete-value and a discrete-time modulation signal with a first component and with a second component, and furthermore designed to emit a power control signal, which is derived from the first component, to a control output.

Also included is an amplifier circuit which is designed to assume one operating state from a set of a first operating state and at least one second operating state, with the first operating state and the at least one second operating state being characterized by at least one characteristic variable.

A predistortion device is also provided and comprises a first connection which is coupled to the first tap of the signal processing device; a second connection which is coupled to the second tap of the signal processing device; a first output tap, a second output tap, a control input and a selection input.

The device also includes a first signal path, in which the first connection is connected to the first output tap, and the second connection is connected to the second output tap of the predistortion device; a memory having a plurality of predistortion coefficients stored in it, in which a first number of predistortion coefficients are associated with the first operating state of the at least one amplifier circuit, in which at least one second number of predistortion coefficients are associated with the at least one second operating state.

An address unit is also included and designed to select the first or the second number of predistortion coefficients depending on a control word, which is derived from the at least one characteristic variable, at the selection input. In addition, the predistortion unit comprise a second signal path, which has switching elements for distortion of at least one of the signals which are applied to the first or second connection of the predistortion device with a predistortion coefficient from the number of predistortion coefficients selected by the address unit depending on a signal which is applied to the control input and the signal which is applied to the first connection.

The predistortion device is designed to select the first or the second signal path depending on a signal which is applied to the control input. The transmitting device includes a modulation unit having an output, having a first and a second input which are coupled to the output taps of the predistortion unit, with the modulation unit being designed to convert signals which are applied to its input side to a carrier signal, and to emit the carrier signal to the output which is coupled to the input of the amplifier circuit. Also including is a power control unit having an input which is connected to the control output of the signal processing device, having a first output which is connected to the control input of the predistortion device, and having a second output which is coupled to the at least one amplifier circuit for gain adjustment. The power control unit is also designed to emit a control signal for predistortion at the first output, and an adjustment signal at the second output, depending on the power control signal at its input.

According to one embodiment of the invention, the transmitting device comprises elements which activate the predistortion device when required. A decision on this is governed by the signal which is applied to the control input of the predistortion device, and is provided by the power control unit. Predistortion by means of the predistortion device is thus carried out in the second signal path only when the linearity requirements for the output signal from the transmitting device can no longer be complied with. In a situation such as this, the invention provides for the discrete-value and discrete-time modulation signal which is applied to the inputs of the predistortion device to be distorted by the switching elements in the predistortion device.

Appropriate distortion is carried out by means of a predistortion coefficient which is determined from a number of predistortion coefficients by means of an address unit from a memory. The selection of the predistortion coefficient from the first or from the second number of different predistortion coefficients is dependent on a characteristic variable of an amplifier circuit in the transmitting device. This characteristic variable is used to characterize the transmission characteristic of the amplifier circuit, and thus allows suitable selection of a predistortion coefficient in order to correct for the distortion caused by the non-linear transmission response, in the output signal from the amplifier circuit.

On the one hand, the transmitting device according to the invention reduces the current drawn in the transmitting device since the predistortion device is only ever active when this is defined by the power control unit. On the other hand, the selection of a suitable number of predistortion coefficients and subsequent definition of one of these predistortion coefficients always results in suitable distortion of at least one component of the discrete-value and discrete-time modulation signal. Furthermore, it is possible to determine the operating state of the at least one amplifier circuit in a non-continuous form by redefinition of the characteristic variable. It is sufficient to occasionally check whether the operating state of the at least one amplifier circuit has changed in the meantime. If required, a new number of predistortion coefficients can then be selected from the characteristic variable by the address unit.

In one embodiment of the invention, means are provided for recording the at least one characteristic variable. These means are designed to emit the control word to the selection input of the predistortion device. In another embodiment, these means are designed to record a temperature of the amplifier circuit. In another embodiment, they are designed to record a current drawn or a supply voltage of the amplifier circuit. In yet another embodiment, the means are suitable for recording an impedance or an impedance change, or a reflection coefficient at a signal output of the amplifier circuit. In a further embodiment, they are designed to determine a phase and/or an amplitude of an output signal from the at least one amplifier circuit.

The recording means, which may be designed both for continuous recording of the characteristic variables and for recording at specific time intervals, determine that operating state in which the at least one amplifier circuit is currently being operated. The recording of the characteristic variable can always be used to select, via the selection input, the number of predistortion coefficients which best describe the current operating state of the at least one amplifier circuit.

In one embodiment of the invention, the means for recording have a directional coupler which is coupled on the input side to an output of the at least one amplifier circuit, and is designed to emit a signal element from a signal which is applied to its input side. In one embodiment of the invention, the output of the directional coupler is connected to an envelope curve detector. The envelope curve detector is used to determine an envelope curve of the fed-back signal which is emitted from the at least one amplifier circuit.

From the envelope curve of the fed-back signal, it is possible by means of comparison with the envelope curve of the undistorted discrete-value and discrete-time modulation signal to determine possible distortion by the at least one amplifier circuit as a result of its non-linear characteristic. In another embodiment, the output of the directional coupler is connected to a first input of a phase detector. The phase detector has a second input, which is coupled to the output of the modulation unit, and is designed to form a difference between signals which are applied to its input side, and to emit this difference to the selection input of the predistortion unit.

In this embodiment, the phase detector is used to determine any phase distortion between the signal emitted from the amplifier circuit and the undistorted, phase-modulated carrier signal.

In another embodiment of the form of the invention, the transmitting device comprises a demodulation unit which is coupled to the output of the amplifier circuit. The demodulation unit is designed to convert a signal emitted from the amplifier to a third component and a fourth component. One output of the demodulation unit is coupled to the selection input of the predistortion unit.

In this embodiment, the signal emitted from the at least one amplifier circuit is demodulated again and is converted to a baseband signal, rather than determining the envelope curve and/or the phase of the output signal from the at least one amplifier device. The baseband signal with a third and a fourth component contains the information about possible distortion. Any distortion, and thus also an operating state of the at least one amplifier circuit, can be determined by comparison with the undistorted discrete-value and discrete-time modulation signal.

In another embodiment of the invention, each number of predistortion coefficients is associated with a first address part. Each predistortion coefficient in each number is in turn associated with a second address part. The first and the second address part form an address of a predistortion coefficient within the memory. The address unit of the predistortion unit is designed to determine the first address part.

In this embodiment of the invention, the predistortion coefficients are stored in the memory in such a way that the predistortion coefficients which are associated with one number each have the same first address part. Predistortion coefficients which are stored in the memory and which each have the same associated first address part belong to the same number and are used to describe the same operating state of the at least one amplifier circuit. Thus, in this embodiment, the address unit defines the first address part by means of the evaluation of the characteristic variable and/or of the operating state of the at least one amplifier circuit. The second address part, which selects one specific predistortion coefficient from the number of predistortion coefficients, is determined as a function of the first component and the power word.

For this purpose, in one embodiment of the invention, the predistortion device has an addressing unit which has a scalar multiplication unit. This scalar multiplication unit is designed to multiply a value of the first component by a factor which is derived from a signal which is applied to the control input. In this embodiment, the first component is scaled. The second address part for definition of predistortion coefficients can expediently be determined from the first component. The scaling is used to take account of the maximum amplitude occurring in the discrete-value and discrete-time modulation signal.

The address unit thus selects a number of predistortion coefficients, and then determines one of these coefficients from the first component and the power control signal.

In a further embodiment, the switching elements in the second signal path are in the form of a scalar multiplication unit or an addition unit. The scalar multiplication unit is designed to multiply the first component by the predistortion coefficient. This results in the first component being distorted in a suitable manner. The addition unit is designed in a corresponding manner to add the second component to the predistortion coefficient. If, in one embodiment, the first component represents an amplitude element and the second component represents a phase element of the discrete-value and the discrete-time modulation signal, the amplitude element is in this embodiment multiplied by a predistortion coefficient, and/or the phase component has a coefficient added to it or subtracted from it. In this example, it is possible to provide just one scalar multiplication unit, one addition unit or one scalar multiplication unit and one addition unit in the second signal path of the transmitting device.

In a further embodiment, the modulation unit has a phase locked loop. In its feedback path, this phase locked loop contains a frequency divider with an adjustment input for adjustment of the division ratio of the frequency divider. The adjustment input is connected to the second output tap of the modulation unit. This embodiment of the transmitting device allows a carrier signal to be phase-modulated with the signal which can be tapped off at the second output tap of the modulation unit. In one embodiment of the invention, the at least one amplifier circuit has a modulation input for adjustment of its gain. This modulation input is coupled to the first output tap of the predistortion device. Alternatively, the modulation unit contains a mixer, whose first input is connected to the first output tap of the predistortion device and whose local oscillator input is connected to the output of the modulation unit. In this embodiment, the modulation unit together with the amplifier circuit form a polar modulator. Alternatively, in another embodiment, a polar transmitter is provided, with a phase locked loop as well as a variable-gain amplifier.

The provision of a polar modulator or of a polar transmitter which is coupled to the output of the predistortion unit leads to a different predistortion condition. While, in the example of a polar transmitter, predistortion is required in particular when signals which are applied to the input side have only a small amplitude, distortion is caused in a polar modulator in particular as a result of high input signal amplitudes. For this reason, in one embodiment of the invention, the power control unit for evaluation of the power control word is provided with a reference value.

In one embodiment, a corresponding control word is emitted to the predistortion unit from the power control unit when the power control word is above a reference value. In one alternative embodiment, the control word is produced when the power word is below the reference value.

BRIEF DESCRIPTION OF THE DRAWINGS

The invention will be explained in detail in the following text using a plurality of exemplary embodiments and with reference to the drawing, in which:

FIG. 6 is a graph illustrating signal details in order to illustrate distortion, FIG. 7 is a diagram illustrating a number of tables as a function of different numbers of measurement points, FIG. 10 is a block diagram illustrating an exemplary embodiment of a predistortion unit for phase distortion, FIG. 11 is a block diagram illustrating an exemplary embodiment of the circuit for determination of the address of the predistortion coefficient.

DETAILED DESCRIPTION OF THE INVENTION

Figure 1:
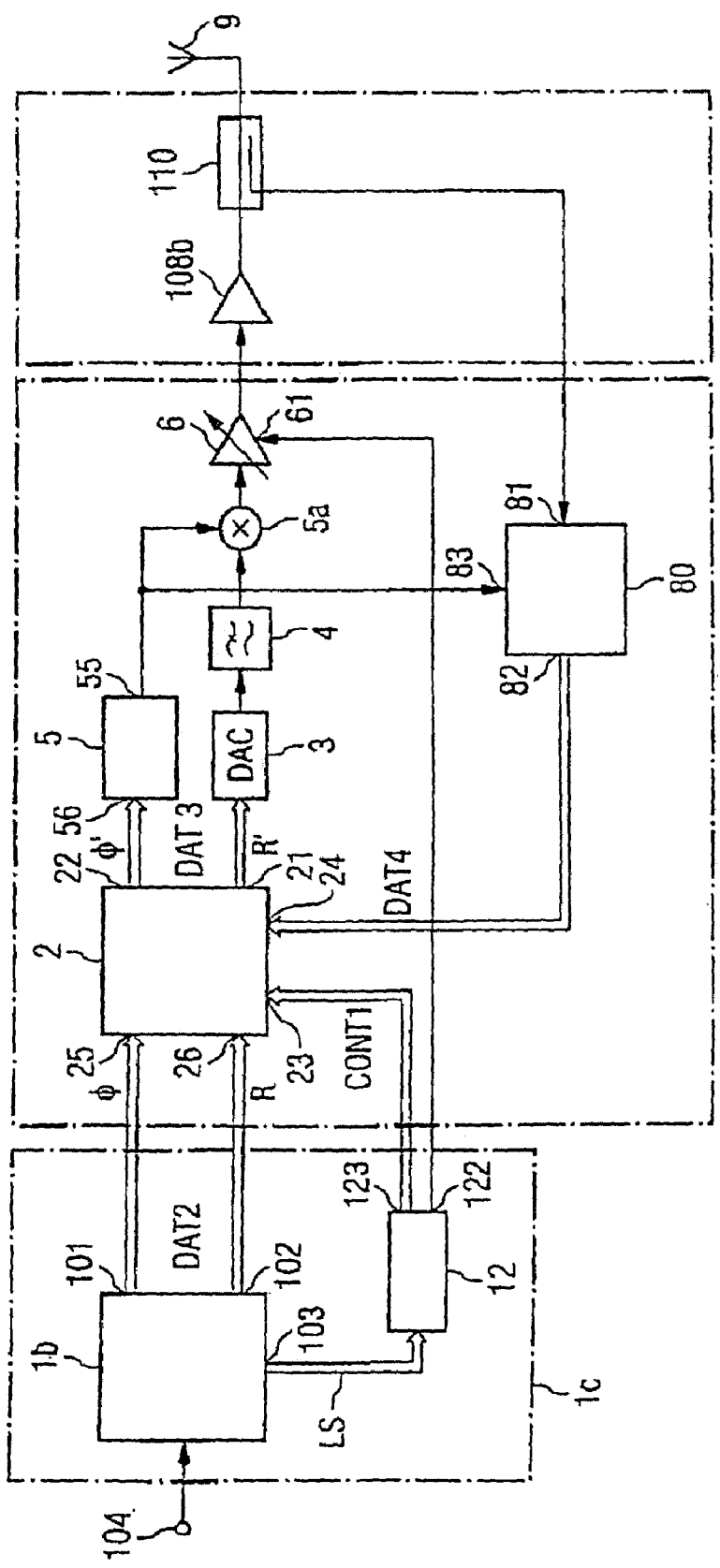
FIG. 1 is a block diagram illustrating an embodiment of a transmitting device according to the invention.

FIG. 1 shows one embodiment of a transmitting device having a predistortion unit according to one embodiment of the invention. The transmitting device is in this example implemented in a plurality of semiconductor bodies, however this is not required. Elements for predistortion as well as the subsequent modulation onto a carrier signal and the analog signal processing are implemented in a semiconductor body as an integrated circuit. Power amplifiers, matching networks and sensors for measurement of the output signal power are accommodated in a further semiconductor. It is, of course, possible for these elements also to be in the form of an integrated circuit in a single semiconductor body.

The signal processing of the baseband signal including the determination of the output power as well as the modulation of the data to be transmitted in accordance with a predetermined modulation method is implemented on a further chip by means of a baseband signal unit. A standardized interface is provided between the semiconductor bodies and allows data to be interchanged between the two integrated circuits.

The transmitting device according to the embodiment is based on the proposed principle of not carrying out the predistortion of a signal to be transmitted continuously. Instead, predistortion is performed selectively when the requirement for the linearity of the carry signal to be emitted can no longer be complied with using an undistorted digital modulation signal.

Interference and distortion in the output signal arise from the fact that the transmitting device includes circuits and/or components which have a non-linear area in at least part of their characteristic. If the drive level and the input signals which are applied to the circuits and/or the individual components now have a corresponding amplitude, this can lead to the circuits and/or the components being operated in this non-linear area. In consequence, the output signal varies with respect to the input signal in a non-proportional manner, and thus includes non-linear elements. This leads to distortion and interference in the output signal, which can cause transmission errors.

FIG. 6 illustrates the influence of the non-linearity using the example of an amplified signal. The curve C1 in this example represents an ideal, undistorted input signal. As can be seen, the points P1, P2 and P3 on the curve C1 are each separate from one another by an interval of 3.5 dB. In contrast, the curve C2 shows an amplified and a distorted output signal. In this example, the interval between the points P2 and P3 is now 3 dB, while the interval between the points P1' and P2' is only 2 dB. The ratio between the intervals on the distorted output curve C2 no longer matches the input signal on the curve C1. This is therefore referred to as the signal based on the curve C2 not being linear with respect to the signal on the curve C1. This is caused by different external operating conditions, which can lead to distortion of the amplified output signal.

Figure 5:
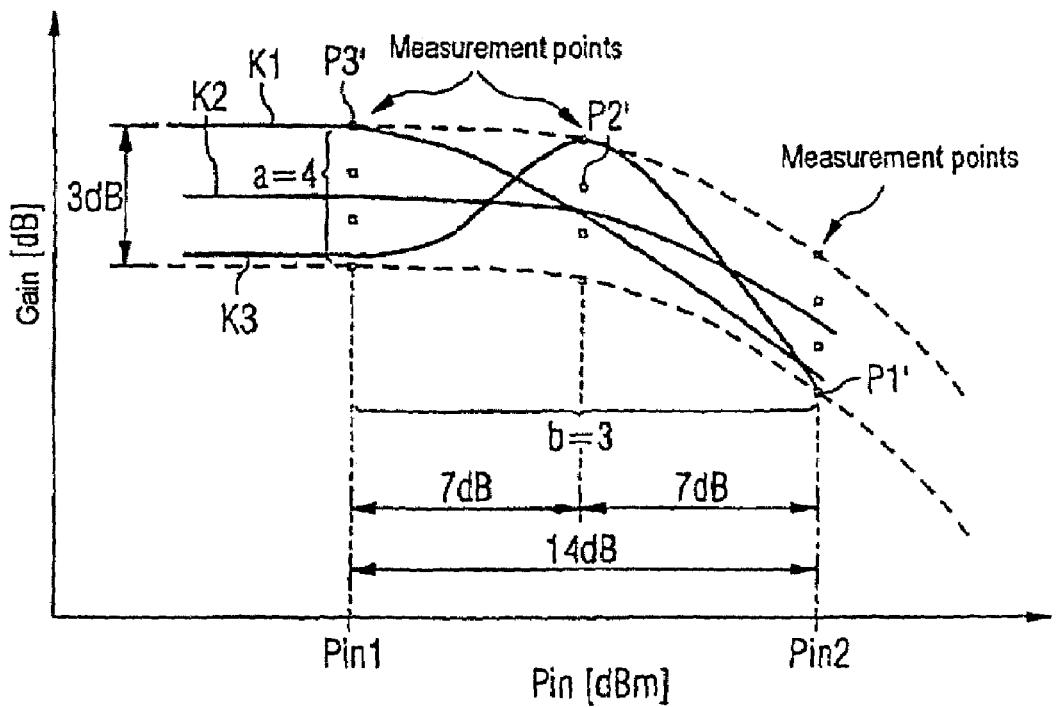
FIG. 5 is a graph illustrating a family of characteristics of an amplifier in order to illustrate the various operating states.

FIG. 5 shows a family of characteristics of an amplifier circuit for different external operating conditions. This figure shows the gain in dB plotted against the input power Pin in dBm. The gain on the curve K1 is shown, by way of example, for an initial operating temperature of the amplifier circuit. As can be seen, the curve K1 falls sharply as the input power Pin rises from the input power Pin1 to the input power Pin2. Because of the different gain, which is dependent on the input signal, an input signal is amplified by a different amount.

The curve K2, which is recorded at a second operating temperature of the amplifier circuit, shows a different behavior and a considerably weaker reduction in the gain. A curve K3 in turn shows the transmission characteristic for a third operating temperature. In this example, the gain even increases considerably in a small region of the input power level, after which it falls again. The increase can be explained, for example, by an additional bias change in the amplifier circuit, which is dependent on the corresponding operating temperature.

The examples of the transmission characteristics of an amplifier illustrated here thus indicate the various external operating parameters to which the amplifier circuit is subject. When these external operating parameters change, the families of characteristics of the amplifier also change. In other words, it is possible to identify the various transmission characteristics by measurement of the gain at individual input power levels, and to draw conclusions about the external operating parameters, and thus about the overall operating state of the amplifier circuit.

The invention provides for a plurality of tables to be provided, which contain predistortion coefficients for particularly significant and frequently occurring characteristics. By determination of individual measurement points and subsequent identification of the appropriate characteristic, it is thus possible to select one of these tables, and to determine a predistortion coefficient. The greater the number of measurement points which are used to determine the families of characteristics, the greater the number of individual characteristics which can be identified, and the more accurately the predistortion coefficients can be matched to the individual characteristics, and thus to the possible non-linearities.

In the example illustrated in FIG. 5, different measurement points are determined for a total of three different input signal amplitudes Pin b=3. The input signal amplitudes which are used for identification of the characteristic in this example are each separated from one another by 7 dB. Four measurement points a=4 are selected, in a corresponding manner, for the gain, for example. One table is associated with each of these combinations of the measurement points. The current form of a characteristic can be determined by sample-like measurements, in the present example a total of three measurements per family of characteristics in FIG. 5, and this can be used as the basis for deciding which of the tables should be used.

In this example, it is sufficient to measure the output signal just at a small number of points by means of an envelope curve detector, and then to compare this with the real undistorted input signal. The characteristics can be determined approximately from the comparison in one embodiment of the invention. In particular, there is no need to determine an absolute value of the gain, and in fact it is sufficient to determine the relative intervals between the individual measurement points, for example as illustrated in FIG. 6.

In one embodiment, transmission characteristics which have approximately the same profile depending on the input signal amplitude and just have different gain levels are assessed as the same characteristics and require only one table. By way of example, these will be the characteristics shown by dashed lines in the family of characteristics in FIG. 5.

FIG. 7 shows an estimate of the number of individual tables as a function of the number of measurement points a and b. In this example, a maximum fluctuation range of 3 dB is assumed for the individual transmission characteristics, and they are quantized with a stepwidth of 1 dB. The 3 dB fluctuations of the individual characteristics do not indicate any offset within the amplifier circuit, but only a relative gain fluctuation within one curve. The determined transmission characteristic is characteristic of specific external operating conditions. Its profile is used for predistortion of the digital baseband signal, in order to compensate for the output signal non-linearity caused by the amplifier.

Predistortion is expediently carried out by distortion of the digital baseband signal before being supplied to the circuits and/or components which have the non-linear transmission response. Since, as already mentioned above, any non-linearity in the output signal is highly dependent on the input signal amplitude, it is advantageous to have accurate information about the maximum amplitude occurring in the input signal. This leads to one aspect of the invention. Knowledge of the maximum amplitude that occurs allows predistortion to be applied and removed selectively. This is made dependent on a limit value, for example.

In this example, use is made of the fact that, as can be seen in the illustration in FIG. 5, the transmission characteristics are independent of the input power Pin at input signal amplitudes below Pin1. Linear transmission accordingly takes place in this area, and the output signal is directly proportional to the input signal. There is therefore no need for predistortion. It is therefore possible to save power to disable the predistortion feature in such instances, particularly in mobile transmitters, for example in mobile telephones, and thus to increase the operating time.

FIG. 1 shows a transmitting device which operates using the above-discussed principles. For this purpose, the transmitting device contains a baseband unit 1b, which is implemented together with a power control unit 12 in a semiconductor body 1c. The baseband unit 1b has an input 104 to which the data to be transmitted is applied. This data is, for example, speech data or image data.

The data to be transmitted is in the form of a digital data stream. The baseband unit produces so-called symbols from this, depending on the chosen modulation type. One symbol is formed by a number of bits in the digital data stream in accordance with a rule which is predetermined by the modulation type. The baseband unit 1b thus combines a number of bits to form a symbol.

In the example of the QPSK modulation type, two bits in each example form one symbol. In this context, the QPSK modulation type is referred to as being a two-value modulation type. In a corresponding manner, three bits are in each example combined to form one symbol in the 8-PSK modulation type. Other embodiments of modulation types, for example quadrature amplitude modulation, in some examples combine four or more bits to form one symbol and all such alternatives are contemplated by the invention. A stream composed of a plurality of symbols is thus formed from a digital data stream with a large number of bits. Each symbol has a unique associated phase and amplitude.

The baseband unit 1b is designed to temporarily store a number of symbols, and to determine their maximum amplitude. Temporary storage of a number of symbols is equivalent to temporary storage of data items to be transmitted. In consequence, the baseband unit evaluates the data stream and determines the maximum signal amplitude of the data items to be transmitted during a time period. In addition to the maximum amplitude during this time period, the baseband unit 1b receives information about the desired output power of the transmitted signal from the transmitting device, the so-called nominal transmission power. The baseband unit uses the information about the maximum amplitude and the desired output power of the transmitted signal during this time period to calculate a power word, which it emits at its output 103.

At the same time, the amplitude element R is emitted at a first output tap 102 as a first component of a discrete-value and discrete-time or digital modulation signal DAT2. The corresponding phase element $\Phi$ is emitted at a second output tap 101 as a second component of the discrete-value and discrete-time modulation signal DAT2. The modulation signal is supplied to the input connections 25 and 26 of a predistortion unit 2. The predistortion unit 2 also has a control input 23 as well as a selection input 24. A control signal CONT1 can be supplied to the control input 23, and a selection signal DAT4 can be supplied to the selection input 24. The two signals control the response of the predistortion unit 2.

On the output side, the predistortion unit 2 has a first output tap 22 for emitting a phase element $\Phi'$, as well as a second output tap 21 for emitting the amplitude element R' of a possibly distorted discrete-value and discrete-time modulation signal DAT3. The phase element $\Phi'$ is supplied to an input 56 of a phase modulator 5.

Figure 2:
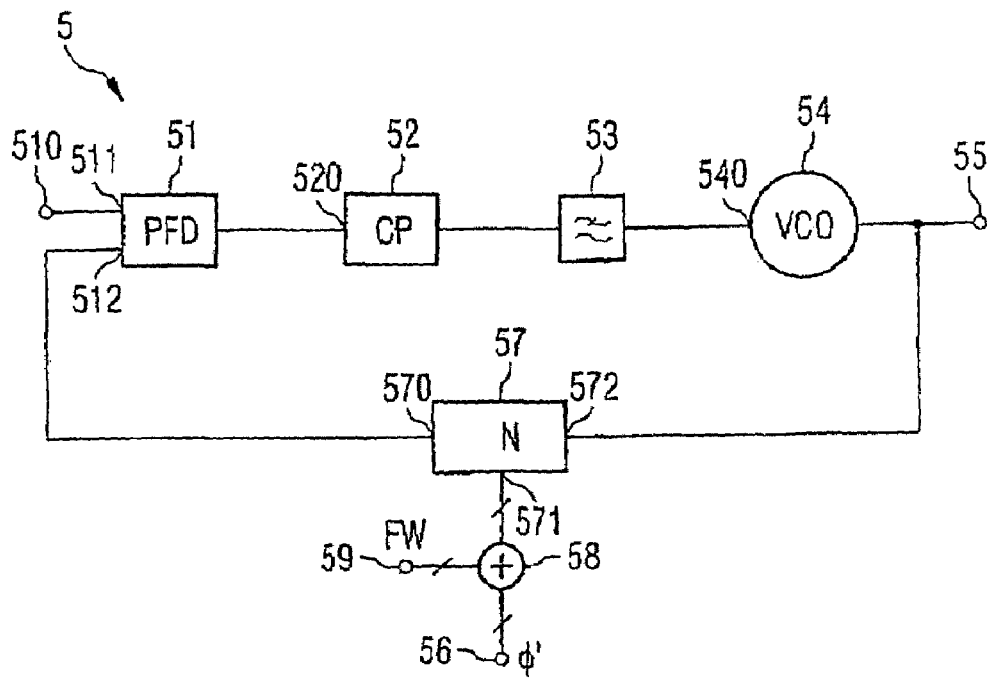
FIG. 2 is a block diagram illustrating an exemplary phase modulator for use in a transmitting device according to the invention.

FIG. 2 shows an embodiment of the phase modulator, which essentially comprises a phase locked loop with a phase detector 51, a charge pump 52, a low-pass filter 53 as well as a voltage controlled oscillator 54, which is connected in series and produces an output signal at a carrier frequency. The output of the voltage controlled oscillator at the same time forms the output 55 of the phase modulator. Furthermore, the output of the voltage controlled oscillator is connected to a frequency divider 57 in a feedback path. On the output side, the frequency divider 57 is connected to a feedback input 512 of the phase detector 51. A reference signal is applied to a reference input 511 of the phase detector 51.

The frequency divider 57 contains an adjustment input 571 for supplying an adjustment signal. This controls the division ratio of the variable frequency divider 57. The adjustment input 571 of the frequency divider is connected to the inputs 59 and 56 via an addition unit. The phase information $\Phi'$ is supplied to the input 56 as a digital signal. The input 59 is used to supply a frequency word FW for adjustment of the carrier frequency of the output signal from the voltage controlled oscillator. The additional phase element $\Phi'$ is used to vary the division ratio of the frequency divider 57. The frequency divider 57 is, for example, in the form of a sigma-delta modulator.

The variation of the division ratio in the variable frequency divider 57 changes the frequency of the signal that is fed back from the oscillator 54 to the feedback input 512. The phase detector 51 determines any phase difference between the signals applied on the input side, and uses this difference to produce a control signal, which is applied, via the charge pump CP and the low-pass filter 53, as a control signal to the control input 540 of the voltage controlled oscillator 54. A changing control signal at the control input 540 leads to a change in the output frequency of the voltage controlled oscillator 54. Supplying the phase element $\Phi'$ to the adjustment input 571 of the frequency divider 57 results in modulation of the phase and/or frequency of the carrier signal from the voltage controlled oscillator 54.

The output 55 of the phase modulator 55 is, according to the embodiment shown in FIG. 1, connected to a local oscillator input of a mixer 5a. A further signal input of the mixer 5a is connected via a low-pass filter 4 and a digital/analog converter 3 to the output tap 21 of the predistortion unit 2 for the amplitude element R' of the modulation signal DAT3. The mixer 5a modulates the amplitude of the already phase-modulated carrier signal, and emits it to an input of a controllable amplifier 6. On the output side, the controllable amplifier 6 is connected to a power amplifier 108b. The output of the power amplifier is connected to an antenna 9 via a directional coupler 110.

A plurality of active components, some of which have a characteristic with non-linear areas, are provided throughout the entire signal processing chain of the illustrated transmitting device. An output signal which is non-linear with respect to the input signal is produced, depending on the input signal. This so-called non-linearity of the output signal is mainly caused by the power amplifier 108b. A feedback loop with an envelope curve detector and a phase detector 80 is provided in order to correct for this non-linearity. The detector is connected by its input 81 to the output of the directional coupler 110, and forms a part of a feedback chain. The directional coupler 110 feeds back a portion of the signal that is emitted from the amplifier 108b to the envelope curve and phase detector 80. The envelope curve and phase detector 80 has a further input 83, which is connected to the output 55 of the phase modulator 5. On the output side, the phase modulator 5 emits the selection signal DAT4, which is passed to the selection input 24 of the predistortion unit 2.

Figure 4:
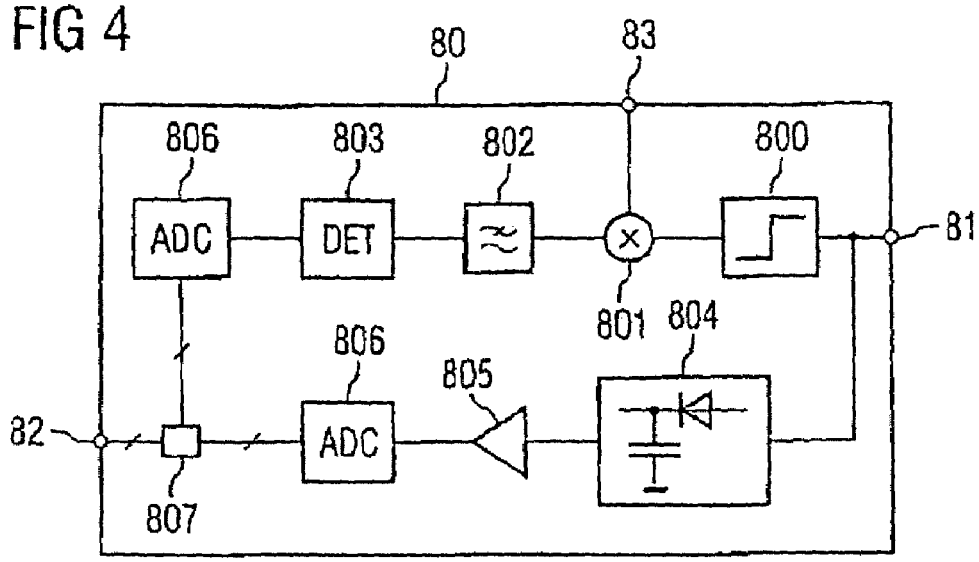
FIG. 4 is a block diagram illustrating an embodiment of a detector for recording the operating state.

FIG. 4 shows one example of the envelope curve and phase detector. It should be stressed that, in this embodiment, the envelope curve and phase detector are in the form of one unit. This is particularly worthwhile when both the phase of the output signal and the amplitude of the output signal are required in order to determine predistortion. In a situation in which non-linearity in the amplitude element is dominant to a considerable extent, it is sufficient to provide only the envelope curve detector. In a corresponding manner, if the phase non-linearity is dominant over the amplitude non-linearity, a phase detector is sufficient to determine the phases in the non-linearity.

The envelope curve detector in the envelope curve and phase detector 80 contains a level detector 804 with a diode connected in the signal path, and with a capacitor arranged in parallel with it. On the output side, the level detector 804 is connected to an amplifier 805. The output of the amplifier is connected to an analog/digital converter 806, which uses this to produce a digital signal, which describes the envelope curve of the signal that is applied to the input 81.

The phase detector in the envelope curve and phase detector 80 contains a limiting amplifier 800, whose output is connected to a mixing element 801. A second input of the mixing element 801 is connected to the input 83 of the envelope curve and phase detector 80. The element 801 forms the difference between the phases of the signals applied on the input side. The result is supplied via a filter 802 to a detector 803, whose output signal is once again converted to a digital word. If there any distortion in the phase element of the output signal caused by the high-power amplifier 108b, the difference between the phases at the respective inputs 81 and 83 is not equal to zero. The magnitude of the difference is registered in the detector 803, and thus represents a measure of the distortion of the phase element. The present exemplary embodiment of the envelope curve and phase detector 80 includes an element 807 which uses the digital information about the phase difference and the information about the envelope curve to produce a selection word DAT4, which it emits at the output 82.

In addition to the selection signal DAT4 at the selection input 24, the predistortion unit 2 is also supplied with a power control signal CONT1. This is used to determine whether there is any need at all for distortion by the predistortion unit 2.

When the input signal amplitudes are low, the amplifier 108b produces only a small amount of distortion, or none, so that there is no need for predistortion. In consequence, the predistortion unit can be switched off, thus reducing the current drawn. This is particularly advantageous when the baseband unit 1b has precise knowledge of the power level that it is necessary to emit, the desired output power and the maximum amplitude occurring in the discrete-value and discrete-time modulation signal DAT2. The stated information is supplied by means of a power word LS from the baseband unit 1b via the input 103 to the control unit 12. The control unit 12 has a first output 122, which is connected to the control input 61 of the controllable amplifier 6. A second output 123 is connected to the control input 23 of the predistortion unit 2.

A power control unit 12 evaluates the power word LS from the baseband unit 1b. The power word LS contains the information for the desired nominal power at the output of the transmitting device. In addition, the power control unit 12 knows the nominally selected gain factor in the power amplifier 108b. The power control unit 12 uses the power word and the information about the gain factor to calculate a gain signal, which it emits at the output 122. This sets a gain factor for the controllable amplifier 6. The control signal is used to adjust the nominal power to be emitted. The signals applied on the input side during a specific time period are amplified by the amplifier 6 by the selected factor, thus producing an average output power.

Furthermore, the power word LS includes information about the maximum amplitude occurring in the discrete-value and a discrete-time modulation signal DAT2. This amplitude is compared with a reference value, by the power control unit 12. If this is greater than the reference value in the present embodiment, then predistortion of the discrete-value and discrete-time modulation signal is required in order to comply with the linearity requirements. In this example, the power control unit 12 produces a corresponding control signal at the output 123. Otherwise, a control signal is produced at the output 123 which switches off the predistortion unit 2.

Depending on the embodiment, the predistortion unit 2 can provided different distortion levels. If, for example, it is mainly the amplitude that is being distorted by the downstream components, then it is sufficient just to distort the amplitude element. This is referred to as the AM/AM-nonlinearity being dominant over the AM/PM non-linearity. In a corresponding manner, it is likewise possible if the AM/PM non-linearity is dominant over the AM/PM non-linearity, for the predistortion unit to be designed to distort only the phase element Φ.

Figure 8:
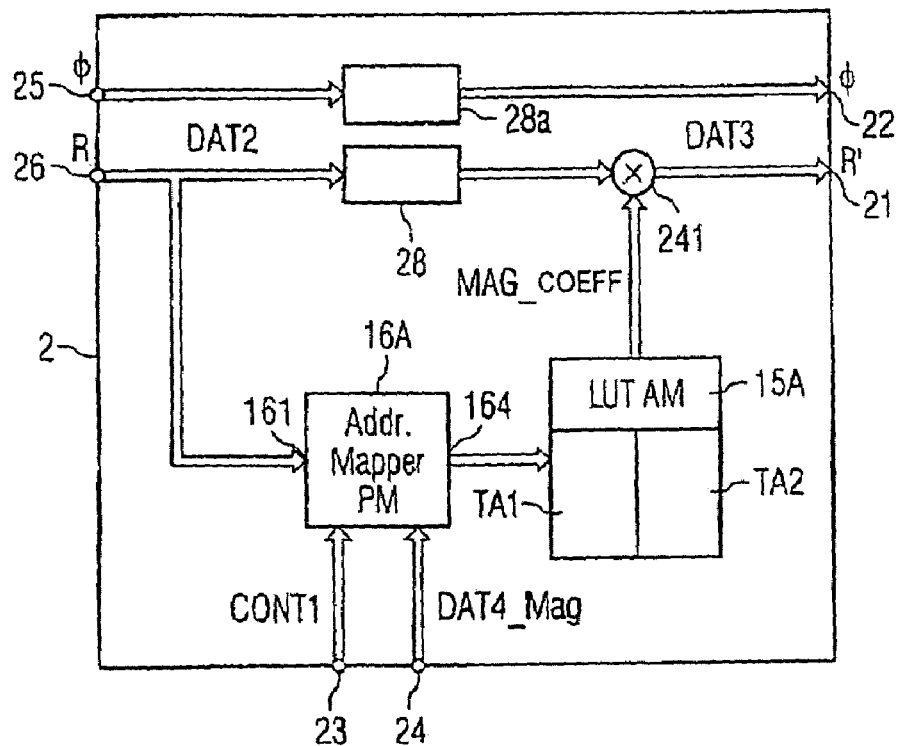
FIG. 8 is a block diagram illustrating an embodiment of a predistortion unit for amplitude distortion.

FIG. 8 shows one example embodiment of the predistortion unit for distortion of the amplitude element. Components having the same effect and/or the same function are provided with the same reference symbols.

The predistortion unit 2 contains a memory 15A, in which a plurality of predistortion coefficients are stored. The predistortion coefficients are combined in logic tables TA1 and TA2. The individual tables TA1 and TA2 contain the predistortion coefficients which are suitable for predistortion in specific external conditions. These particular conditions are determined by the fed-back signal and by the envelope curve detector. An address circuit 16A is provided in order to address one of these tables and, in particular, one of the predistortion coefficients in this table. The output 164 of this address circuit 16A is connected to the memory in order to select one of these predistortion coefficients MAG_COEFF. A first input 161 of the address unit is connected to the input connection 26 for the amplitude element R. The address circuit 16A is likewise connected to the control input 23 and to the selection input 24 for the selection signal DAT4_MAG.

The predistortion unit 2 also has a first delay element 28a, which is connected between the input connection 25 and the second output tap 22. The delay element 28a is used to delay the signal delay times which are required in order to select the corresponding predistortion coefficients from the table, and to carry out the predistortion with the amplitude element. A further delay element 28 is connected between the input connection 26 and a multiplication unit 241. The delay produced by this delay element is necessary in order to provide the address circuit 16a and the memory 15a with sufficient time for selection and provision of the necessary predistortion coefficients MAG_COEFF. The multiplication unit multiplies the amplitude element R by the predistortion coefficient MAG_COEFF, and emits the result at the output tap 21 as the distorted amplitude element R'.

The memory 15A is chosen to be sufficiently large to contain a plurality of tables TA1, TA2. The predistortion coefficients in the individual tables are each selected by means of an address. This is the address that is provided by the address circuit 16A.

Figure 9:
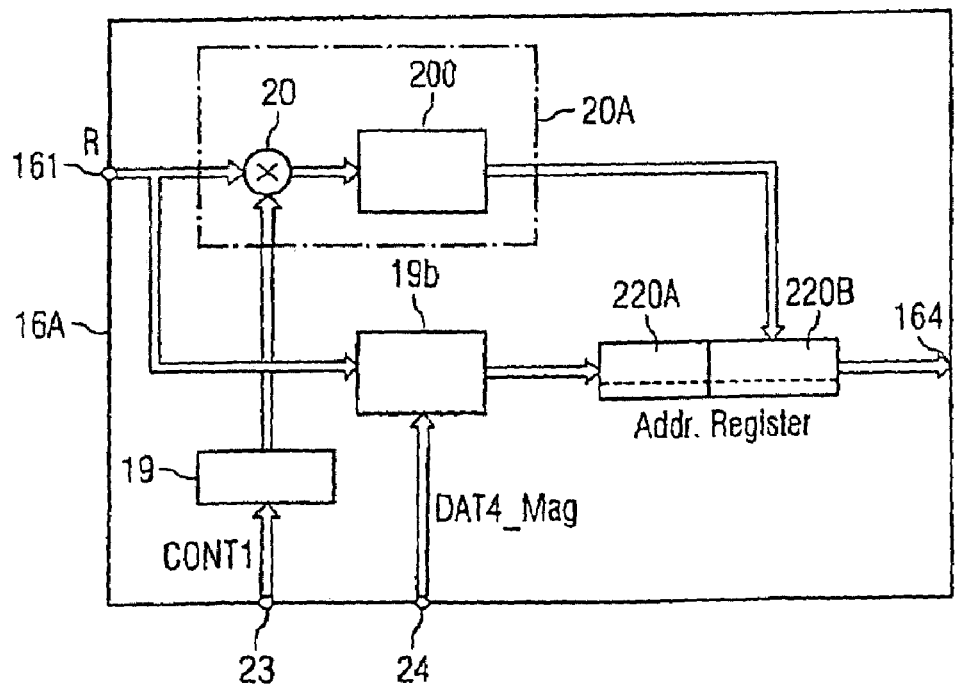
FIG. 9 is a block diagram illustrating an exemplary embodiment of a circuit for determination of the address of a predistortion coefficient.

FIG. 9 shows an address 16A such as this. One important element is an address register Addr.Register, which comprises the two register elements 220A and 220B. The address register comprises a number of bits, with the first bits, that is to say the "most significant bits" or MSB, indicating the first address part, and the further bits, that is to say the "least significant bits" or LSB, indicating the second address part.

The first address part in the register element 220A is used essentially to select one of the table elements TA1, TA2. For this purpose, the register element 220A is written to by a logic decision-making unit 19b. This decision-making unit is supplied with the output signal DAT4_MAG at the selection input 24. A further input is connected to the input connection 161 for the amplitude element. The decision-making unit 19b uses the amplitude element R and the selection signal DAT4_MAG to produce the first address part, which is used to select one of the two table elements TA1 or TA2.

A quantizer 200 is provided in order to produce the second address part in the register element 220B, and its input side is connected to a scalar multiplication unit 20. The inputs of the scalar multiplication unit are connected on the one hand to the input 161 for supplying the amplitude element R and to a device 19. The device 19 uses the control signal CONT1 at the control input 23 to produce a factor which is multiplied by the amplitude element R. The amplitude element R is thus scaled. The address scaling unit 20A is thus used to scale the table address as a function of the control signal CONT1. After scaling of the amplitude element, it is simply quantized in order to obtain the required address with respect to the second address part. Quantization is carried out whenever the word length of the scaled amplitude element R is greater than the length of the second register element, so that a reduction is necessary.

The power control unit 12 also uses the control signal CONT1 to take account of the input level for the controllable amplifier 6. If, for example, a higher power level is required at the output of the power amplifier 108b, coefficients in higher addresses are selected, corresponding to the control signal CONT1.

FIG. 10 shows a further embodiment of the predistortion device. The predistortion device 2 is in this example designed for distortion of the phase element. This also takes into account the fact that the predistortion unit 2 predistorts the phase element Φ only when this is necessary, that is to say when the output signal linearity requirement can no longer be complied with. The decision of predistortion is made by evaluation of the control signal CONT1.

The predistortion unit 2 for this purpose contains a switching device 27 with a switching input 271 which is connected to the control input 23. The switching device 271 is connected on the input side to the input connections 25 and 26. On the outside side, it is connected to a first signal path, which couples the input connections 25 and 26 of the predistortion device 2 to the output taps 21 and 22. This switching device 27 can also be implemented in the predistortion unit 2, as shown in FIG. 8, without any problems. It is then arranged between the inputs 25, 26 and the delay elements 28, 28a.

Switching elements for the predistortion are accommodated in a second signal path and contain a delay element 28b, which is connected between an output of the switching device 27 and an addition unit 242. The delay time of the delay unit 28b is chosen such that an address circuit 16P has sufficient time for selection of a predistortion coefficient PH_COEFF from a memory 15P. A further delay unit 28a is arranged between the output tap 21 of the amplitude element R' and the switching apparatus 27, in order to compensate for any possible time delay. In this example as well, a plurality of table elements TP1 and TP2 are stored in the memory 15P. Each of these table elements has a plurality of predistortion coefficients TK1, TK2, TK3 and TK4. As can be seen, the predistortion coefficients are associated with one of the two tables TP1 or TP2.

The switching apparatus 27 is designed such that, depending on the control signal CONT1, it either activates the first signal path, that is to say it connects the input connections directly to the output taps, or activates the second signal path for predistortion.

FIG. 11 shows an embodiment of the address circuit 16P, part of whose design matches that of the address circuit 16A for the amplitude elements. In this example as well, a decision-making unit 19b is provided, which uses the selection signal DAT4_PH and the phase element of the input 162 to write a first address part to the register element 221A of an address register. The first address part is once again used to select one of the tables TP1, TP2 stored in the memory 15P with the predistortion coefficients PH_COEFF for predistortion of the phase element Φ. The second address part for the register element 221B of the address register has the result from the address scaling unit 20A written to it.

When the predistortion is activated by the predistortion unit, the output signals can be changed so as to produce a wider dynamic range and thus more quantification noise. It is thus advantageous to operate the digital/analog converter 3 with a higher resolution than is necessary in the undistorted example. If, for example, the magnitude of the predistortion coefficient for the amplitude element is less than the value 2, the analog/digital converter needs to have an additional resolution of one bit.

Figure 15:
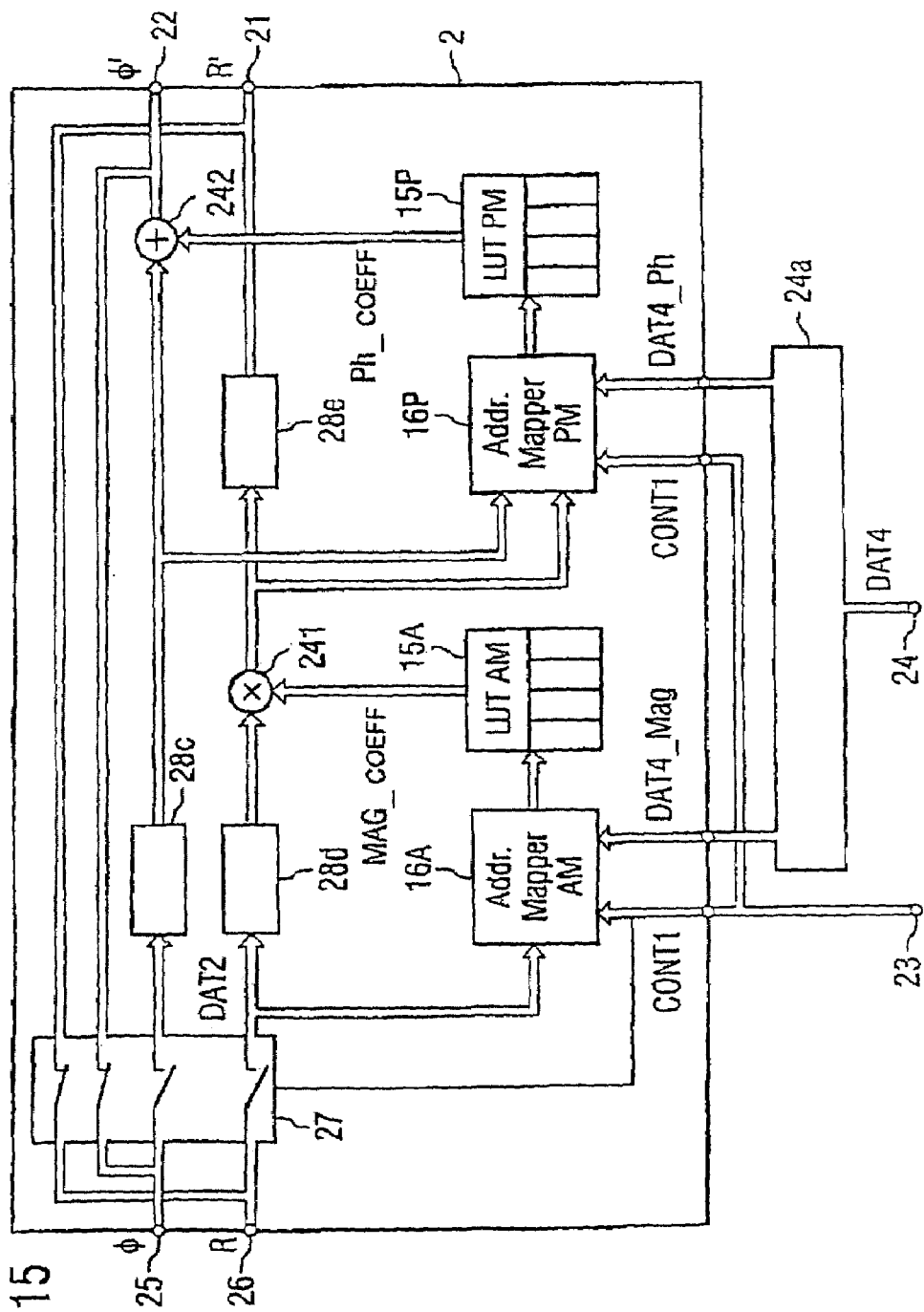
FIG. 15 is a block diagram illustrating another exemplary embodiment of a predistortion unit for amplitude and phase distortion.

FIG. 15 shows yet another embodiment of the predistortion unit, which is designed to distort the amplitude element R as well as the phase element Φ. The two memories 15A and 15P in this embodiment are illustrated as two memories, but they may also be in the form of one memory. The individual predistortion coefficients are then stored in the form of a plurality of table elements in a memory such as this. Each individual table element contains the predistortion coefficients which are suitable for predistortion in specific operating conditions. A selection signal DAT4_MAG as well DAT4_PH is once again provided for selection purposes. This is obtained from a selection signal DAT4, which is supplied to a demultiplexer unit 24A. By way of example, the selection signal is produced by the envelope curve and phase detector based on the embodiment in FIG. 4.

Figure 12:
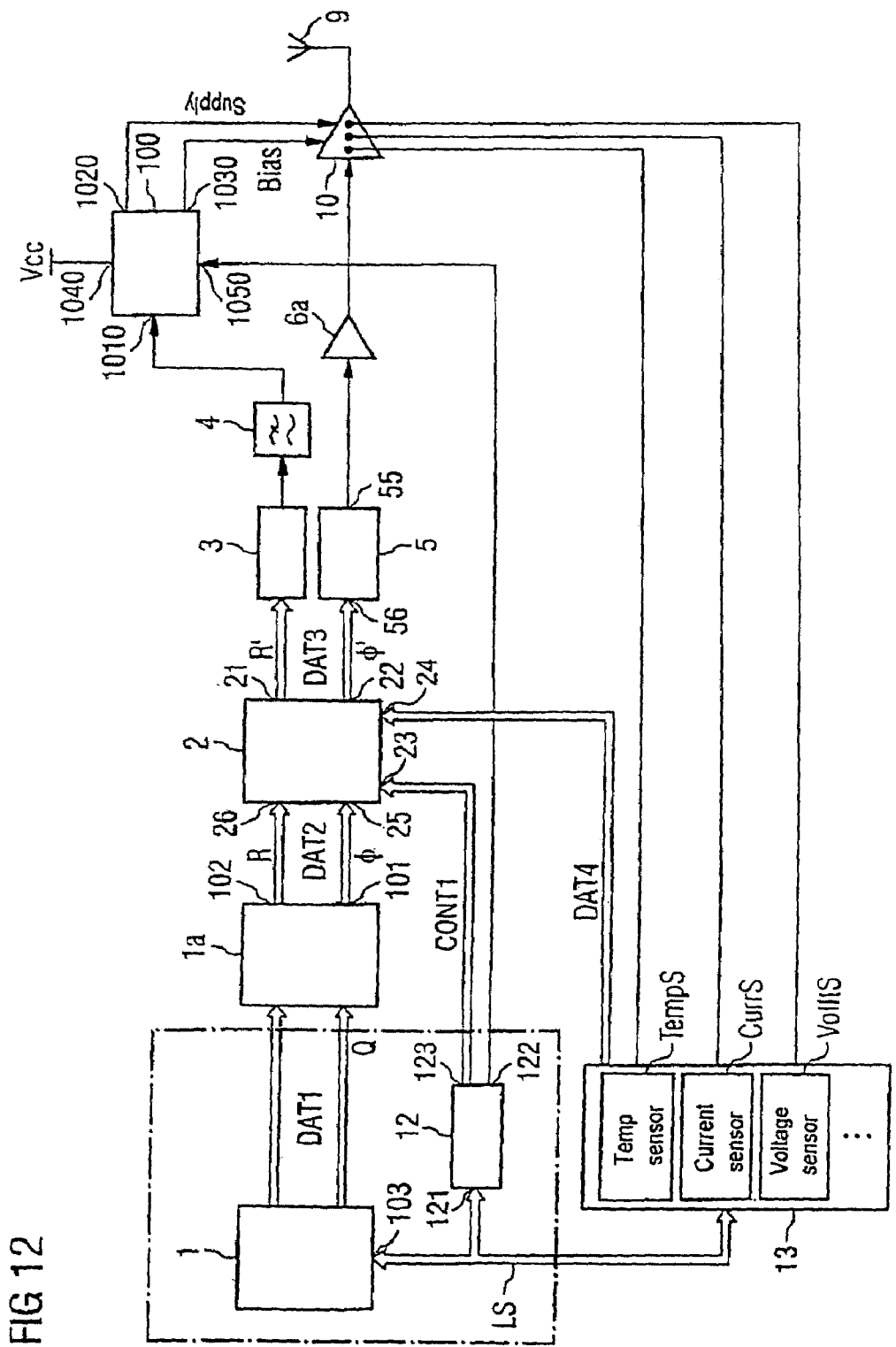
FIG. 12 is a block diagram illustrating another exemplary embodiment of the transmitting device.

A further embodiment of the transmitting device is shown in FIG. 12. Components having the same effect or the same function are also provided with the same reference symbols in this example.

The baseband unit 1, which is in the form of an integrated circuit together with the power control unit 12 in a semiconductor body, is designed to emit a digital modulation signal DAT1 comprising a first component I and a second component Q. The first component I is also referred to as the in-phase component, and the second component Q is referred to as the quadrature component. The discrete-value and discrete-time modulation signal DAT1 with the two components I and Q can be converted by a simple transformation to a corresponding representation with an amplitude element R and a phase element Φ. A transformation unit 1*a* is provided for this purpose, and is connected between the baseband unit 1 and the predistortion unit 2.

The transformation unit 1*a* forms the square of the magnitude of the two components I and Q, and this indicates the amplitude element R. The phase element Φ of the discrete-value and discrete-time modulation signal DAT2 is determined from the components I and Q. The transformed discrete-value and discrete-time modulation signal DAT2 is supplied with its amplitude element R as the first component and its phase element Φ as the second component to the predistortion device 2. The output tap 22 for the phase element Φ' is coupled to the input 56 of the phase modulator 5. In a corresponding manner, the output tap 21 for the amplitude element R' is connected to the digital/analog converter 3, and to the low-pass filter 4.

In this embodiment, a polar transmitter is provided for modulation of the phase element Φ' and of the amplitude element R'. This polar transmitter is characterized in that the amplitude element R' is not modulated onto the carrier signal via a mixer as in the example of a polar modulator, but the modulation is carried out with the amplitude element R' via modulation of the supply voltage or of the bias current for an amplifier device.

In the present example, an amplifier circuit 10 is provided, whose output side is coupled to the antenna 9 and whose input side is connected via a further amplifier 6*a* to the output 55 of the phase modulator 5. The amplifier circuit 10 has a first supply input for supplying a supply voltage Supply, and a further input for adjustment of its operating point. The corresponding voltages and signals are produced by a supply voltage control circuit 100.

For this purpose, the supply voltage control circuit 100 contains a first control input 1010 and a second control input 1050. The first control input 1010 is connected to the output of the low-pass filter 4 for supplying the amplitude element, which is being converted to a digital signal. The second input 1050 is connected to the output 122 of the power control unit 12. The second control input 1050 is used to supply a regulator signal, which presets an average power level to be emitted for the amplifier 10. An average output power from the amplifier 10 is accordingly set by means of the signal at the control input 1050. The control by means of the supplied amplitude element at the input 1010 modulates the gain of the amplifier 10, and thus the amplitude of the output signal.

Figure 3:
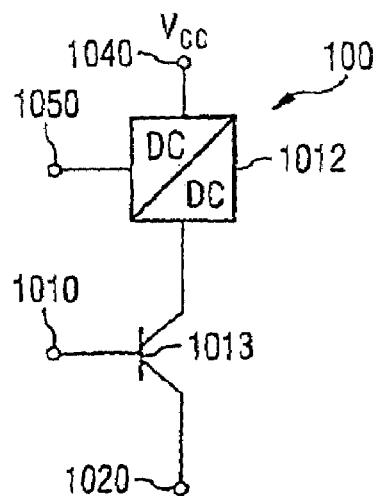
FIG. 3 is a schematic diagram illustrating one embodiment of a supply circuit.

FIG. 3 shows one example of the supply voltage control circuit 100. The supply voltage control circuit 100 contains a DC voltage converter 1012, which is also referred to as a DC/DC converter or as a switched-mode regulator. This is connected to the supply voltage input 1040 and converts a DC voltage at this input to a corresponding output voltage. The transformation ratio of the input voltage to the output voltage is set by means of a signal at the control input 1050. Depending on the application, the DC voltage converter produces an output voltage which is greater than or less than the input voltage Vcc at the voltage input 1040. A DC voltage converter which is designed to increase its output voltage is also referred to as a boost converter. One example of a DC voltage converter which produces a lower output voltage than the input voltage is called a Buck converter.

The output of the DC voltage converter 1012 is connected via a series regulator 1013 to the supply output 1020 of the supply voltage control circuit 100. The series regulator 1013 is in this example in the form of a bipolar transistor, whose control input is connected to the control output 1010. The control signal at the control input 1010 is used to produce a voltage drop across the series regulator 1013, thus changing the supply voltage which can be tapped off at the output connection 1020. The supply voltage for the power amplifier is thus modulated, so that its gain changes as a function of the amplitude element R'.

In the embodiment with a polar transmitter, it should be noted that the transmission response of a polar transmitter is normally highly non-linear when the amplitude elements R' are small. In a corresponding manner, in one example, predistortion is carried out whenever the average amplitude or the amplitude element in the modulation signal DAT2 is small.

In an embodiment of the transmitting device as shown in FIG. 12, the operating state of the power amplifier 10, which is the cause of the majority of the non-linearities that occur in the output signal, is determined by a plurality of sensors. In this exemplary embodiment, there is no feedback of the amplified signal in order to determine the various operating states of the power amplifier 10. Instead, the temperature, the current drawn and the supply voltage and/or the voltage drop across the amplifier 10 are determined. The evaluation unit 13 uses the various operating parameters, which all exert an influence on the transmission response of the power amplifier 10, to produce the selection signal DAT4, which is supplied to the input 24 of the predistortion device 2.

The evaluation circuit 13 is furthermore connected to the baseband unit 1 in order to supply the power control word for further consideration of the nominal power. In addition to the temperature, voltage and current sensors illustrated here, further operating parameters of the power amplifier 10 can be used for assessment and for production of the selection signal DAT4. By way of example, a reflection coefficient can be determined at the output of the power amplifier 10. The reflection coefficient indicates the proportion of the power emitted from the power amplifier 10 which is reflected back again into the power amplifier by downstream elements. The transmission response of the power amplifier 10 can also be changed in this way.

Another possible way to determine the operating parameters and thus to define the overall state of the power amplifier 10 is to determine an input impedance and/or an output impedance of the power amplifier 10. This changes in the event of a mismatch, caused, for example, by a change in the emission characteristic of an antenna. This is caused inter alia by local changes. The unit 13 uses these individual characteristic variables to calculate the instantaneous operating state of the power amplifier 10, and thus uses the selection signal DAT4 to determine the table to be selected which best describes the current operating state.

Depending on the input signal amplitude and the amplitude modulation to be carried out with the aid of the amplitude element R', the power control unit 12 then sets the regulator signal CONT1 in such a way that the predistortion unit 2 determines the correct coefficients from the table element when distortion is necessary.

The transmitting devices which have been described so far contain a polar transmitter or a polar modulator in order to modulate the amplitude element and/or the phase element onto a carrier signal.

Figure 14:
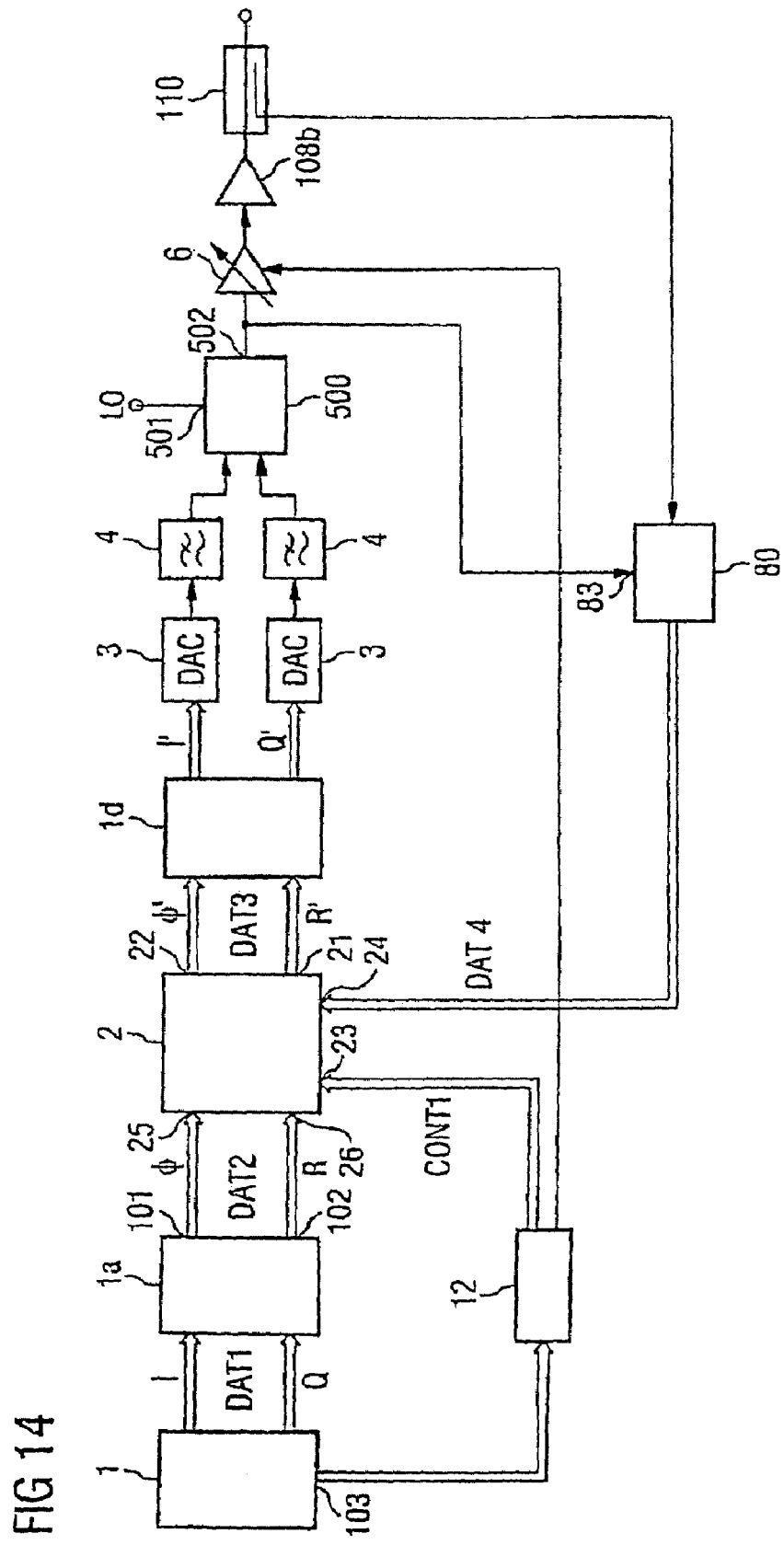
FIG. 14 is a block diagram illustrating an exemplary embodiment of the transmitting device.

However, it is just as possible to provide an IQ modulator for conversion of the modulation signal to the carrier signal. In this example, it is advantageous for the predistortion unit to also be designed to distort the amplitude element and the phase element. The primary reason for this is because a scalar multiplier is sufficient for predistortion of the amplitude element and an adder is sufficient for predistortion of the phase element, as illustrated in FIGS. 8, 10 and 14. This therefore avoids a complex multiplication, as is required for processing of I and Q signals.

FIG. 14 shows an embodiment of a transmitting device with an IQ modulator. Components having the same effect and/or the same function are also provided with the same reference symbols in this example.

The baseband unit 1 is designed to emit a discrete-value and discrete-time modulation signal DAT1 with an in-phase component I and a quadrature component Q. The two components are transformed via a transformation device 1a to a phase element Φ and an amplitude element R, which are supplied to the predistortion unit 2. Depending on the selection signal DAT4 and the control signal CONT1 at the inputs 23 and 24, the predistortion unit produces a discrete-value and discrete-time modulation signal DAT3 with an amplitude element R' and a phase element Φ'. This is transformed back again in a device 1d to an in-phase component I' and a quadrature component Q'. Depending on whether the predistortion unit 2 has carried out distortion of the discrete-value and discrete-time modulation signal DAT2 applied to its input side, the two components I' and Q' are also distorted with respect to the undistorted components I' and Q' of the discrete-value and discrete-time modulation signal DAT1.

The outputs of the back-transformation device 1d are each connected via a digital/analog converter 3 and a low-pass filter 4 to an IQ modulator 500. A local oscillator signal can be supplied to an input 501 of the IQ modulator 500. The IQ modulator 500 uses this to produce two partial local oscillator signals, which have a phase offset of 90° with respect to one another. Two mixers, which are not illustrated here for clarity reasons, within the IQ modulator 500 convert the components I' and Q', which are applied to the input side, with the aid of the two phase-offset partial local oscillator signal to the carrier frequency. The converted signals are added, and are emitted at the output 502 of the IQ modulator 500. The output 502 is connected to a controllable amplifier 6, whose control input is connected to the power control unit 12. On the output side, the amplifier 6 is connected to the input of the power amplifier 108b.

A directional coupler 110 is provided in this embodiment as well, is coupled to the output of the power amplifier 108b and supplies a portion of the signal to the device 80. The device 80 uses this to produce the selection signal DAT4 for the predistortion unit 2. The embodiment of a transmitting device illustrated in FIG. 14 allows a simple implementation of a predistortion unit with a plurality of table elements for selection of predistortion coefficients as a function of an operating state of the modulator 500, controllable amplifier 6 and power amplifier 108b. Distortion in the downstream signal processing chain starting with the back-transformation device 1d and as far as the power amplifier 108b can thus be compensated for by choice of a suitable table with the aid of the selection signal DAT4.

Provision is likewise made for the power control unit 12 to activate the predistortion unit 2 via the regulator signal CONT1 only when the amplitude element R of the discrete-value and discrete-time modulation signal DAT2 exceeds a limit value and the linearity requirements for the signal emitted from the power amplifier 108b can no longer be complied with.

Figure 13:
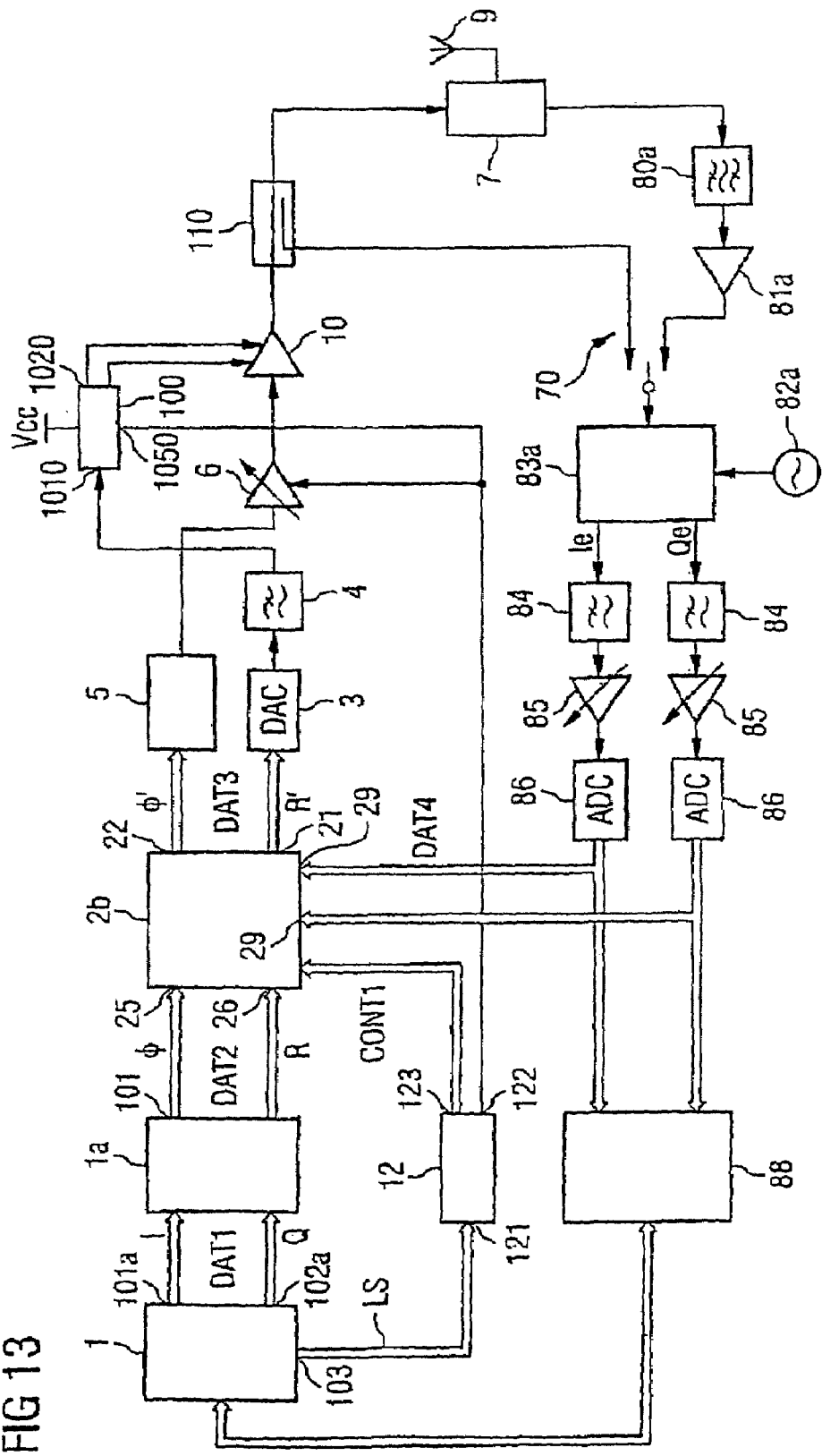
FIG. 13 is a block diagram illustrating an exemplary embodiment of the transmitting device.

FIG. 13 shows a further embodiment of the invention, as can be implemented in a simple manner in a transmitting and receiving device in a mobile communication appliance. Already existing elements can advantageously be used in this example. Components having the same effect and/or the same function are provided with the same reference symbols.

The illustrated embodiment has a transmission path as well as a reception path, arranged in parallel with it. The transmission path contains a polar transmitter and is connected together with the reception path to an antenna connector 7. The antenna connector 7 is used to supply a signal to be transmitted to the antenna 9. A received signal is passed from the antenna connector 7 into the reception path.

The reception path has a bandpass filter 80a and a low-noise amplifier 81a in order to amplify the received signal. The output of the low-noise amplifier 81a is connected to a switching apparatus 70. A second input of the switching apparatus 70 is connected to the output of the directional coupler 110 in the transmission path. The output of the switch 70 is connected to an I/Q demodulator 83a, which can be supplied with a local oscillator signal that is emitted from a voltage controlled oscillator 82a. The demodulator 83a converts a signal applied to its input with the aid of the local oscillator signal, and uses this to produce a converted in-phase component Ie as well as a quadrature component Qe. The two components Ie and Qe of the converted received signal are passed via a low-pass filter 84 and an amplifier 85, and are then converted to digital signals in an analog/digital converter 86. Further signal processing is carried out in a baseband receiving unit 88, which is coupled to the baseband unit for the transmission path 1.

The transmission method, which is based on the use of time slots, and in which data is transmitted during a first time period and data is received during a subsequent time period, it is possible to use a portion of the reception path to determine the operating state of the polar transmitter and in particular of the power amplifier 10. For this purpose, the input of the demodulator 83 is connected, during a transmission time period, to the output of the directional coupler 110 via the switching apparatus 70. The demodulator 83 demodulates a portion of the signal to be transmitted, and uses this to produce an in-phase component Ie and a quadrature component Qe. In this example, it should be noted that the input level for the demodulator 83a must be appropriately chosen in order to ensure that the frequency conversion and demodulation do not cause any distortion. It may therefore be necessary to suitably attenuate the output signal element upstream of the demodulator 83a. The fed-back and demodulated signal element, with its two components Ie and Qe, is converted to digital values.

The digital values at the same time form the selection signal DAT4, thus allow a predistortion unit 2b to select a table element for distortion of the phase element Φ and of the amplitude element R. The simultaneous use of the reception path means that there is no need to provide an additional envelope curve detector as well as a phase detector.

The various embodiments of the individual transmitting devices described here can be combined in various ways, thus implementing the various possible embodiments. Particularly in the example of transmission systems which are based on the use of time slots, it is expedient to use the reception path for the production of the selection signal DAT4. In the example of transmission methods which are continuous over time, and in which transmission and reception take place simultaneously at two different frequencies, the selection signal can be obtained by determination of various operating parameters such as the temperature, the supply current, the supply voltage, the impedance or the reflection coefficient. In the event of distortion in particular of the amplitude element of the carrier signal which is emitted from the amplification device, it may be sufficient just to provide a simple envelope curve detector for production of the selection signal.

Figure 16:
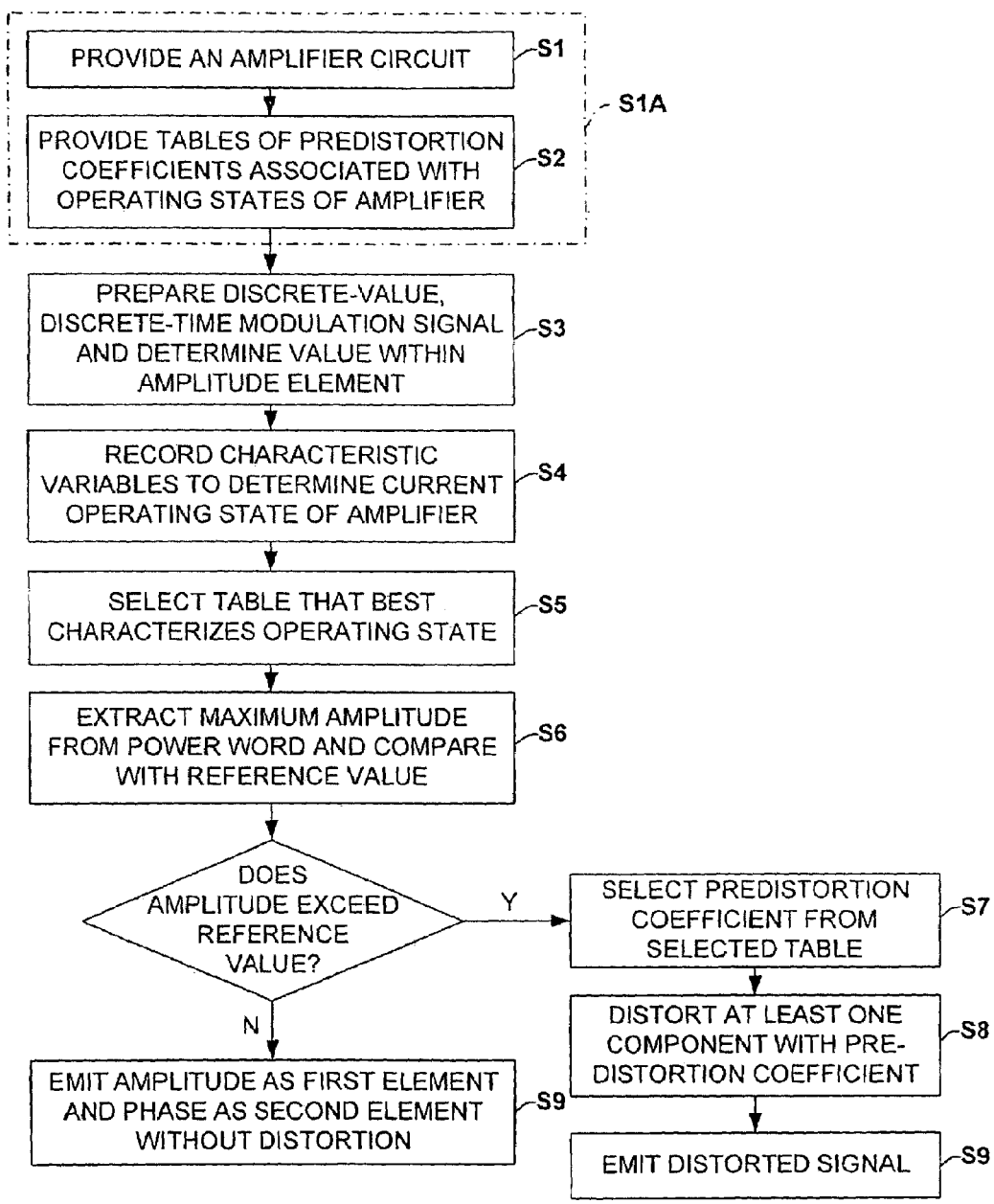
FIG. 16 is a flow chart illustrating an exemplary embodiment of the method according to the invention.

One embodiment of the operating method as can be implemented, for example, in various transmitting devices, inter alia in the transmitting devices described here, is shown in FIG. 16.

In a first step S1, an amplifier circuit is provided. This has a non-linear transmission response, at least in places, so that predistortion of a signal that is applied to its input side may possibly be required during operation of the amplifier circuit. In this example, the amplifier circuit may assume one of a number of possible operating states, which can each be identified by values of a characteristic variable. The operating state of the amplifier setting can be determined by evaluation of the characteristic variables, and can be used to decide whether there is any need at all for predistortion.

A plurality of tables which contain predistortion coefficients are provided in step S2. Each of these tables is associated with an operating state of the amplifier circuit. In this example, it should be noted that each table requires a certain amount of memory space in the technical implementation. The greater the number of tables provided, the greater the required memory space becomes, in a corresponding manner. Conversely, however, a plurality of tables also mean that different operating states of the amplifier circuit can be taken into account.

The tables are used to store predistortion coefficients by means of which predistortion is applied to a signal to be supplied to the amplifier circuit. The predistortion coefficients are chosen such that the predistortion caused by the amplifier circuit is corrected in the operating state associated with the table, and is compensated for. The output signal is then approximately proportional to an undistorted input signal. This is then referred to as linear amplification of the undistorted input signal.

A discrete-value and discrete-time modulation signal is prepared in step S3. This contains an amplitude element R as well as a phase element $\Phi$ as the first and second components. At the same time, a specific value within the amplitude element is determined in step S3. This may, for example, be a maximum of the amplitude element during a specific time period. Alternatively, the crest factor or the average power during this time period could be determined. In principle, the value is used to determine whether predistortion is necessary.

The characteristic variable or the characteristic variables which is or are required to determine the current operating state of the amplifier circuit is or are then recorded in step S4. In the present exemplary embodiment, the step S4 is carried out after the step S3. It is likewise expedient to record the operating variable before the provision of the modulation signal and of the power word. This is particularly advantageous when the operating state of the amplifier circuit changes only relatively slowly over time with respect to the modulation signal.

In the step S5, the recorded characteristic variable and the operating state determined from it are then used to select that table element from the number of tables which best characterizes and describes this operating state.

The predistortion coefficients within this table element are thus those which are best suited for predistortion.

In step S6, the maximum amplitude within the amplitude element is extracted from the power word, and is compared with a reference value. The result of this comparison indicates whether or not there is any need to predistort the signal to be amplified. Since the linearity of an output signal from the amplifier circuit is dependent in particular on the amplitude of the input signal, step S6 is used to determine whether the value of the amplitude element reaches the limit value, and thus whether predistortion is necessary. In this context, it should be noted that the result is also dependent on the amplifier circuit that is used.

If the comparison in step S6 now shows that there is no need for distortion, the amplitude element is emitted as the first component, and the phase element is emitted as the second component, without distortion, in step S9. If, in contrast, the comparison leads to the result that distortion is required, the predistortion coefficient is determined from the selected table on the basis of the power word and the first component, the amplitude element.

At least one of the components is then distorted using the predistortion coefficient in step S8, and the distorted signal is emitted in step S9. The steps S7, S8 and S9 can in this example be applied to the first component R, the second component $\Phi$ or to both components of the digital modulation signal. By way of example, a predistortion coefficient for predistortion of the phase element $\Phi$ is thus selected in step S7. This is done by addressing the predistortion coefficient, with the address depending on the power word and the first component R. The addressed predistortion coefficient is added to the second component, the phase element of the discrete-value and discrete-time modulation signal.

In another situation, a predistortion coefficient is determined from a selected table by addressing in step S7. This predistortion coefficient is used for multiplication of the amplitude element in step S8.

Figure 17:
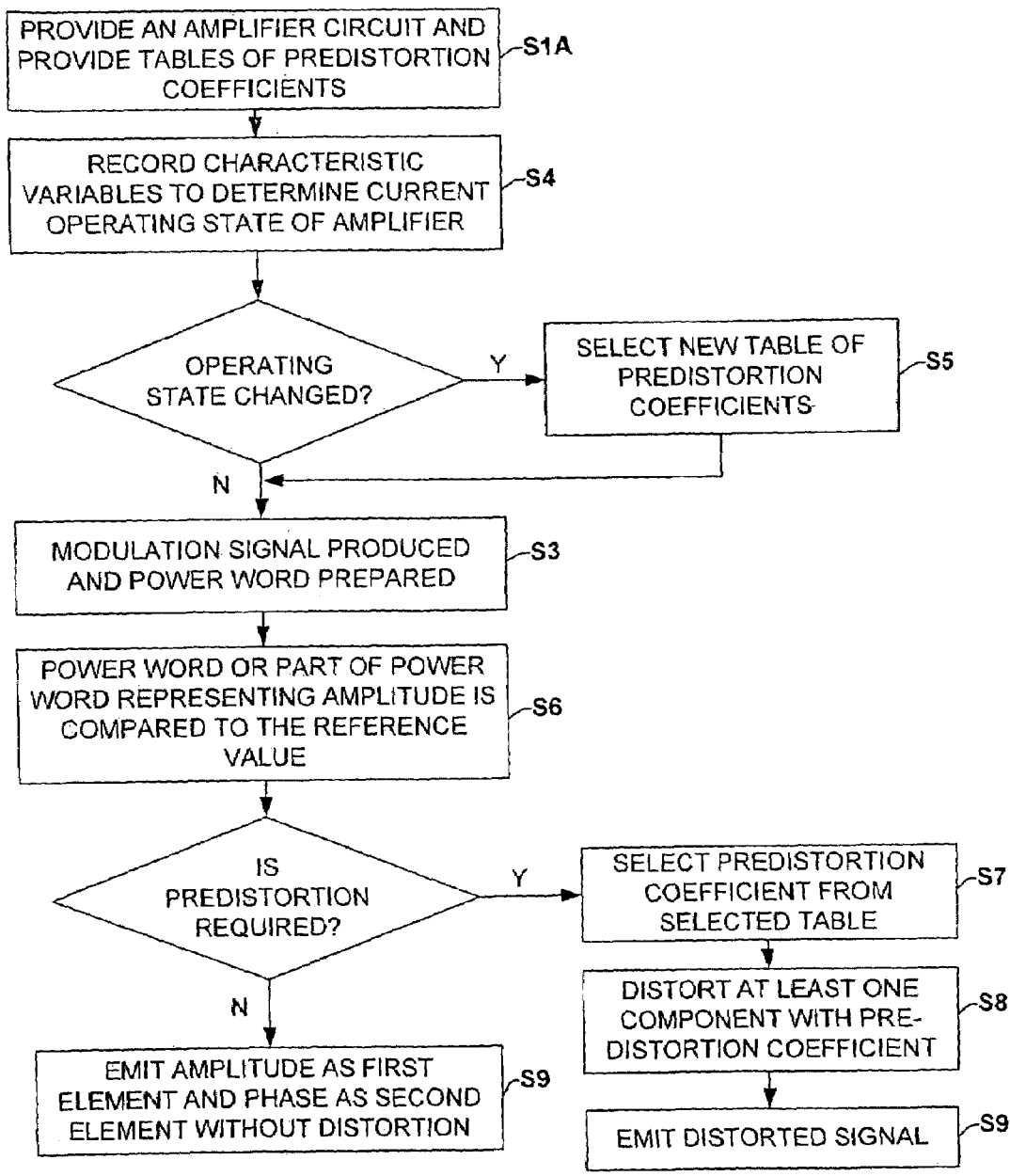
FIG. 17 is a flow chart illustrating an exemplary embodiment of the method according to the invention.

FIG. 17 shows a variant of the method. Identical method steps are provided with the same reference symbols. In step S1a, at least one amplifier circuit is provided and the tables are provided in order to be used for the various operating states. Step S4 is then carried out and characteristic variables are determined which characterize the operating state of the at least one amplifier circuit. The current operating state of the active switching elements in the transmitting device is determined from this. A check is then carried out to determine whether the operating state has changed. A significant change occurs in the operating state of the amplifier circuit in the event, for example, of a temperature rise. Alternatively, it is possible to check whether a specific time has passed since the last check. In this embodiment, the operating state of the amplifier circuit is checked periodically at specific time intervals, on the basis of the recording of the various characteristic variables.

If a check is necessary or if the external operating conditions have changed, then the characteristic variables are recorded, and a new table is selected in step S5. In this example, the expression selection of the table means the production of a corresponding selection signal. The selection signal may, for example, include a first part of an address, which is required to address predistortion coefficients in a memory. The first part of the address, the so-called most significant bits, is the same for predistortion coefficients which belong to a common table and thus characterize one operating state of the amplifier circuit.

The modulation signal is then produced, and the power word prepared, in step S3. The power word in this example as well includes the information about a maximum and/or minimum value of an amplitude element, as well as information about the gain setting and/or the nominal power of a signal to be emitted. In step S6, the power word or the part of the power word which represents the amplitude element is compared with the reference value. In this example as well, a decision is then also made as to whether or not predistortion is required. Predistortion is then carried out as appropriate. Finally, a carrier signal is once again modulated, and the signal is emitted in step S9.

Figure 20:
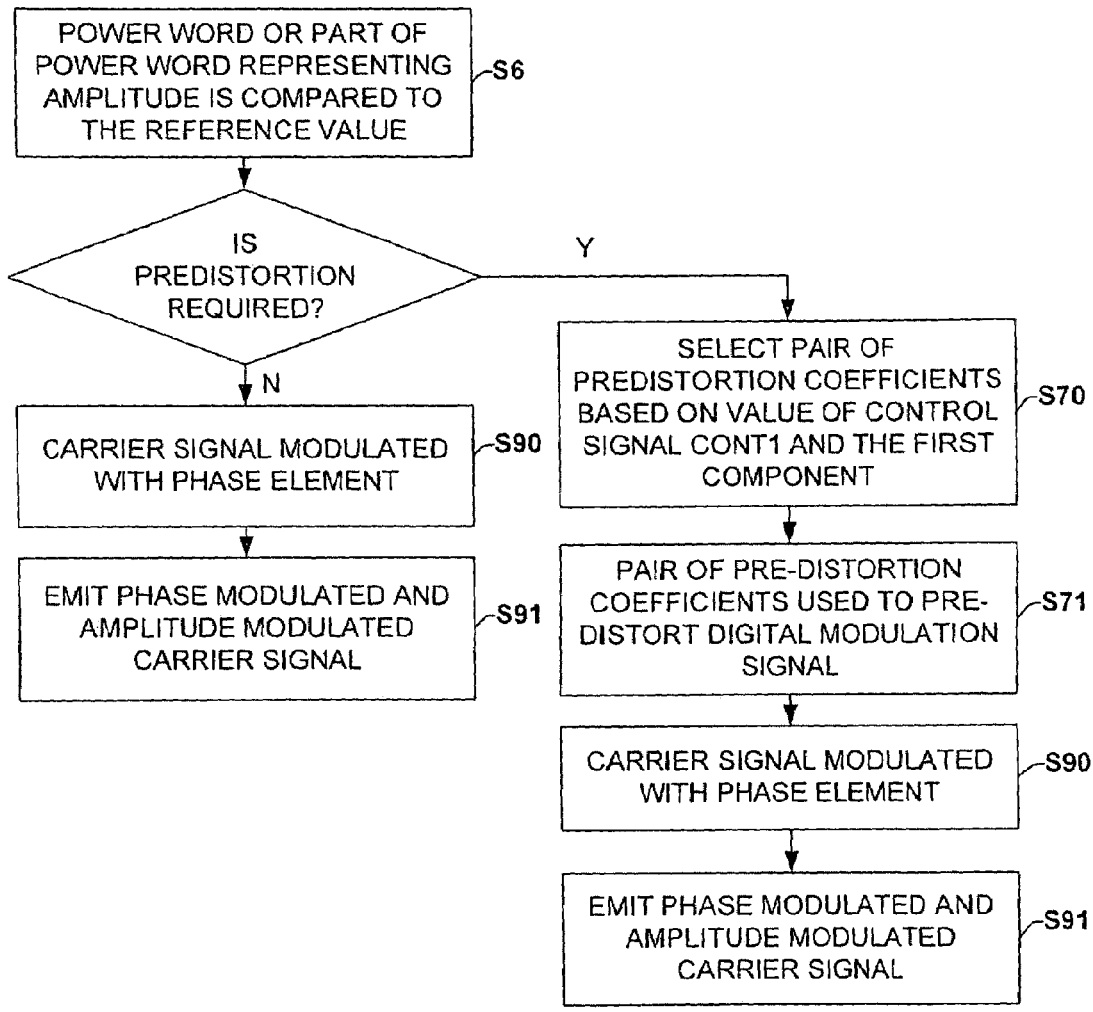
FIG. 20 is a flow chart illustrating another exemplary embodiment of the invention.

This procedure is once again illustrated in detail in FIG. 20. Identical method steps are provided with the same reference symbols. In step S70, a pair of predistortion coefficients is selected from the large number of coefficients on the basis of a value of the control signal CONT1 and of the first component. A first coefficient of the pair is intended for predistortion of the amplitude element R, and a second coefficient is intended for predistortion of the phase element $\Phi$. The two predistortion coefficients are used to carry out predistortion of the digital modulation signal. In this example, the amplitude element is multiplied by the first coefficient of the selected pair. The second coefficient of the pair is added to the phase element.

A carrier signal is then modulated with the phase element $\Phi'$ in the step S90. The amplitude element R' is used to set a supply voltage for an amplifier. Variation of the supply voltage varies the gain factor. The phase-modulated carrier signal is supplied to the amplifier, and is amplified by it on the basis of the predetermined, distorted amplitude element. The phase-modulated and amplitude-modulated carrier signal is emitted at the output, in step S91.

If the comparison is step S6 showed that there was no need for predistortion, the digital modulation signal is emitted with its two components undistorted. Phase and amplitude modulation of the carrier signal are then carried out using the undistorted signal.

Figure 18:
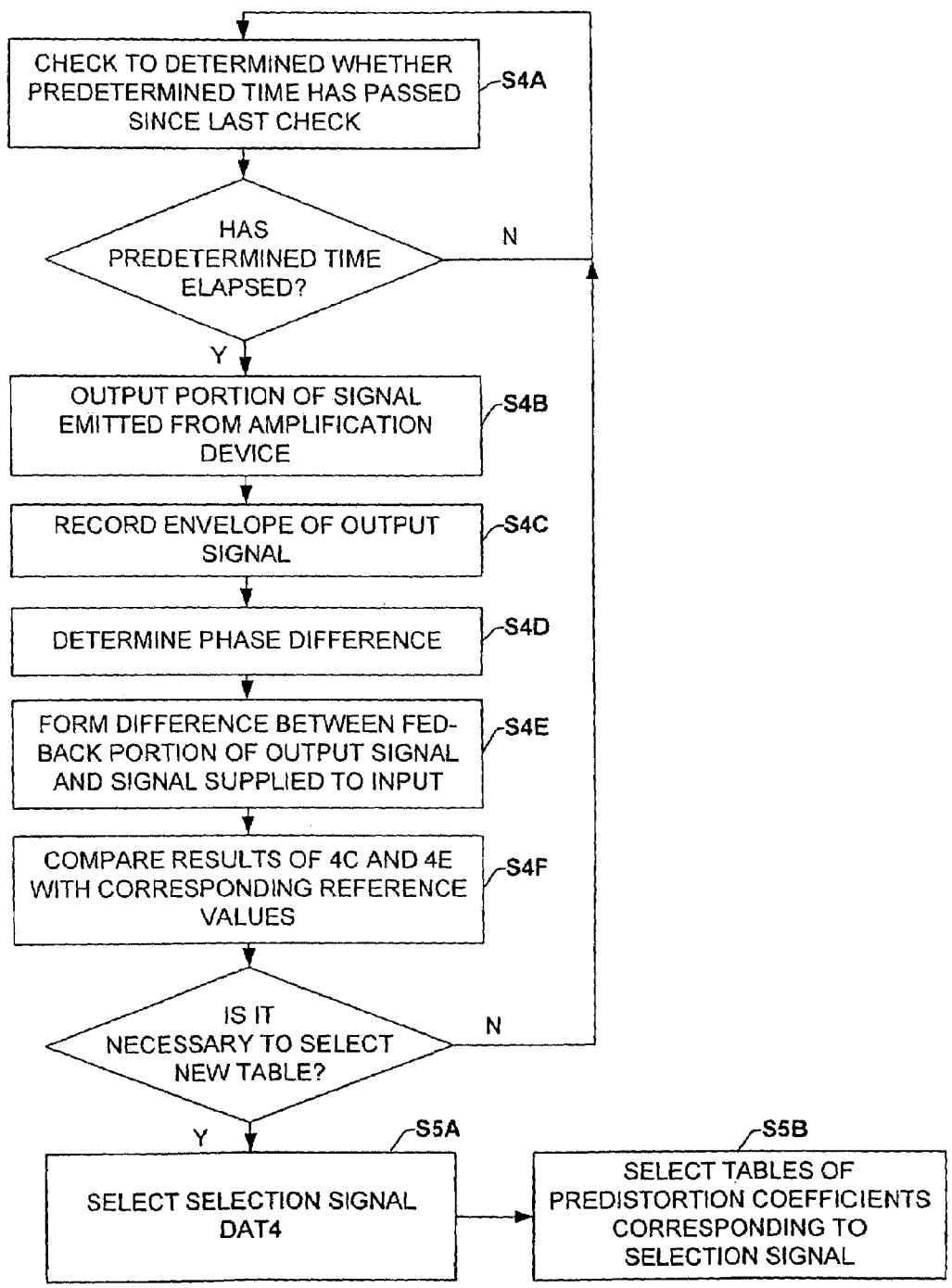
FIG. 18 is a flow chart illustrating an exemplary embodiment relating to the determination of predistortion coefficients according to one embodiment of the method.

FIG. 18 shows an embodiment of the method steps S4 and S5. In this embodiment, a check is carried out to determine whether it is necessary to record the characteristic variables in order to determine the operating state. If this is the example, corresponding characteristic variables are compared with the reference value, and a selection signal for table selection is produced from this. A check is carried out in the step S4a to determine whether a predetermined time period has passed since the previous check. In this embodiment of the method, a periodic check of the operating state of the at least one amplifier circuit is carried out. In transmitting devices which are designed to transmit data using a method which is based on the use of time slots, it would, for example, be expedient to carry out a check such as this during each transmission slot.

Once the time period after which a new check is required has elapsed, a portion of the signal emitted from the amplification device is output in step S4b, and the profile of an envelope of the output signal is recorded. This is used to produce various values which characterize the profile of the envelope and make it possible to deduce the instantaneous operating state and, for example, possible distortion by the amplification device. A phase difference is then determined in step S4d, indicating possible phase distortion of the output signal from the amplification device.

For this purpose, a difference is formed between the fed-back portion of the output signal from the amplification device and the signal which is supplied to the input side of the amplification device. If the amplification device has a non-linear transmission response, the phase of the output signal with respect to the input signal changes, and the resultant difference can be detected. A corresponding digital difference word is also formed from this in step S4, indicating the extent of possible phase distortion. The results of steps S4c and S4e are compared with corresponding reference values in step S4f. It is thus possible to make a decision as to whether any distortion of the output signal as a result of the non-linear transmission response of the power amplifier exceeds a limit, so that predistortion is fundamentally necessary.

The reference values expediently contain information about the previously selected table. It is thus possible to determine whether it is necessary to select a new table by production of a corresponding selection signal. If there is no need to change the selection signal, it is possible to jump directly back to step S4a. Otherwise, a selection signal DAT4 is selected in step S5a, and the correspondingly associated table is selected in step S5b. In this example as well, it should be noted that the selection signal in step S5a may represent an address part for addressing of predistortion coefficients within a memory.

Figure 19:
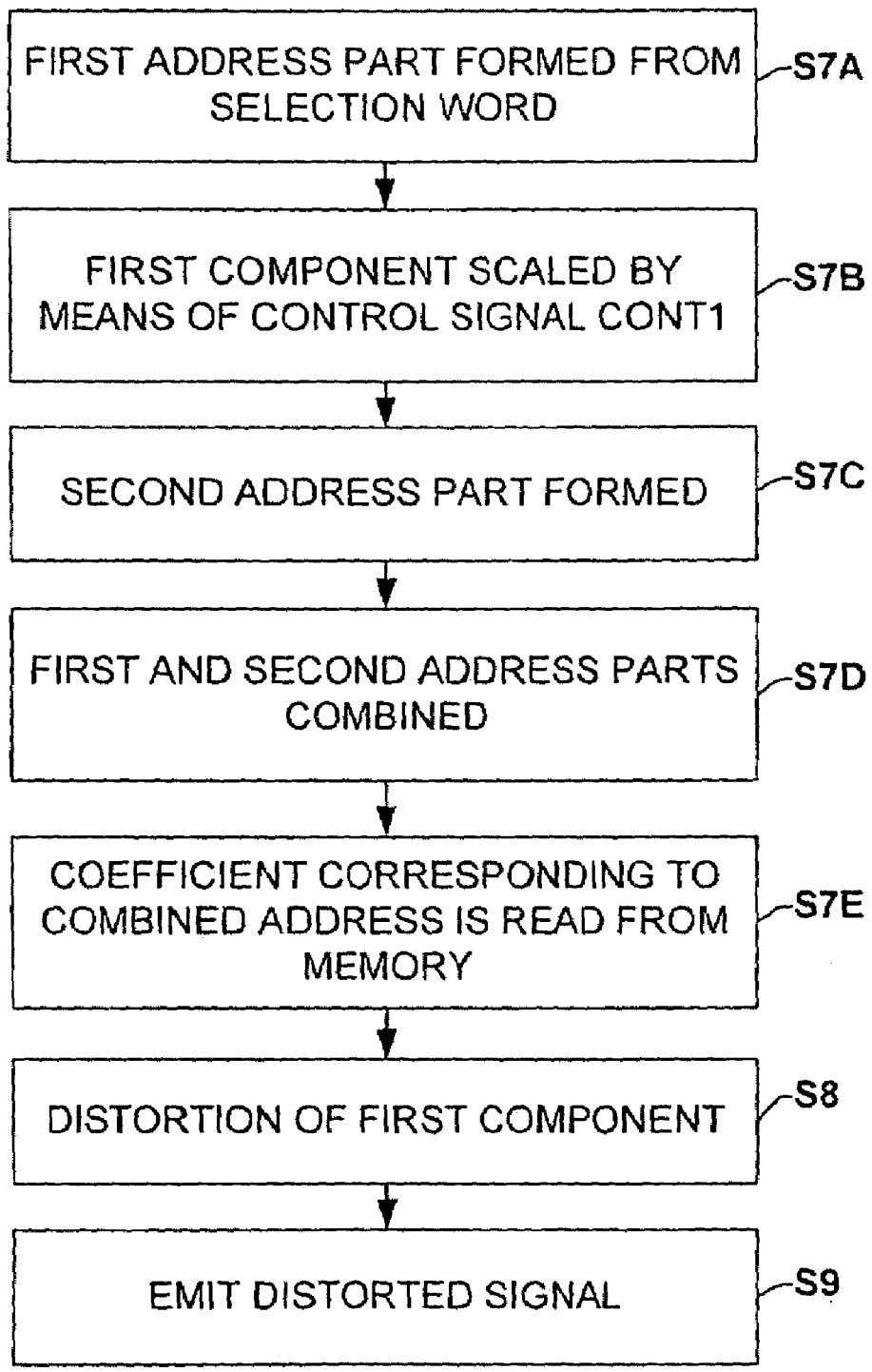
FIG. 19 is a flow chart illustrating an exemplary embodiment of the invention.

FIG. 19 shows a continuation, in particular the determination and the selection of the corresponding predistortion coefficient from the table or from the memory. For this purpose, a first address is formed from the selection word in step S7a. This is expediently done taking into account the first component R, when predistortion of the first component R is intended. This takes account of the fact that the predistortion coefficient is selected from a table which is intended for predistortion of the first component R, and thus of the amplitude element.

In an alternative embodiment, the first address part is formed in step S7a from the selection signal DAT4_PH and the phase element $\Phi$. DAT4_PH indicates the operating state. The address part that is formed is stored in an address register as the first address part in the "most significant bits". At the same time as this, the first component R and thus the amplitude value are scaled by means of the control signal CONT1 in step S7b. This serves to determine those coefficients which are required for the subsequent predistortion from the number of predistortion coefficients within the table which has already been selected by the first address part.

As has already been explained above, the control signal CONT1 contains the information about the maximum value of the amplitude occurring in the amplitude element during a specific time period. If the maximum amplitude element occurring during this time period is now less than an overall maximum possible amplitude element, the predistortion coefficients contained in the table are not all required. As an example, let us assume that the maximum amplitude element that occurs within a predetermined time period is 20% less than the overall maximum possible amplitude element, which in a normalized form has the value unity. In consequence, the first component R is scaled by the factor 0.8 in step S7b in this exemplary embodiment. If, by way of example, one table element now contains 256 coefficients, only 204 coefficients are addressed by the scaling and the subsequent formation of the second address part in step S7c.

The first address part in step S7a selects a number of predistortion coefficients, which are combined in a table. The second address part, which determines a single predistortion coefficient, is formed from the table with the aid of the scaled amplitude value. In step S7d, the address parts formed in step S7a and S7c are combined, and the corresponding coefficient is read from the memory in step S7e. This is used for distortion of the first component in step S8 and the distorted component is emitted in step S9.

Since distortion caused the amplification device is primarily dependent on the amplitude of the input signal and thus of the first component of the discrete-value and discrete-time modulation signal, knowledge of the first component is also necessary for determination of a predistortion coefficient for the second component. The first address part is produced in step S7a with the aid of the selection signal and the value of the second component for the determination and selection of a predistortion coefficient for predistortion of the second component. A first component is then once again scaled by means of the control signal CONT1, and the second address part is formed from this.

The combination of the first and second address parts in step S7d is now used to select an address in the memory in which a predistortion coefficient is stored for predistortion of the second component. The predistortion coefficient is read in step S7e, and is added to the second component in step S8. The second component that has been distorted in this way is emitted in step S9.

The examples of the method described here can be combined in various embodiments. The principle proposed here is not just restricted to linearization of a single amplifier. In fact, it can be used for the entire signal processing chain downstream from the predistortion unit, that is to say in particular for the individual modulators and the downstream amplifiers. The feedback of a signal element from the output signal thus makes it possible to record all of the non-linearities, irrespective of the way in which they are created.

Furthermore, the method is independent of the modulator that is used for modulation of the data to be transmitted onto the carrier signal. The embodiments described here relate to a polar transmitter and a polar modulator, as well as an IQ modulator. Particularly in the example of polar transmitters, in which the power amplifier is preferably operated in saturation and in which, in particular, input signals with small amplitudes are distorted, operation in the described manner is simple and can be implemented without major cost.

The number of tables as well as the individual predistortion coefficients in each table are restricted only by the size of the memory. A greater number of individual tables allows more accurate characterization and description of the individual operating states of the circuit elements connected downstream from the predistortion device. This makes it possible to achieve more accurate predistortion, and thus an improvement in the transmission function.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A method for predistortion of a signal, comprising:
    providing at least one amplifier circuit configured to assume one operating state from a set of a first operating state and at least one second operating state, with the first operating state and the at least one second operating state being characterized by at least one characteristic variable;
    providing a discrete-value and discrete-time modulation signal with a first component and a second component;
    providing a first table comprising a plurality of predistortion coefficients;
    providing at least one second table comprising a plurality of predistortion coefficients;
    producing a power word derived from an output power of a transmission signal or from the first component;
    determining the operating state of the at least one amplifier circuit with recording of the characteristic variable;
    comparing the power word with a reference value and producing a first result or a second result depending on the comparison;
    selection of one table from the first and the at least one second table depending on the determined operating state;
    selecting a predistortion coefficient from the selected table depending on the power word and the first component when the comparison has produced the first result; and
    distorting at least one component of the first component or the second component with the predistortion coefficient when the comparison has produced the first result.

2. The method of claim 1, wherein the at least one component in the distortion step comprises the first component, the method further comprising:
    providing a carrier signal with a phase and an amplitude;
    modulating the phase of the carrier signal with the second component;
    modulating the amplitude of the carrier signal with the distorted first component when the comparison has produced the first result, or with the first component when the comparison has produced the second result; and
    amplifying the carrier signal by the at least one amplifier circuit.

3. The method of claim 1, wherein the at least one component in the distortion step comprises the second component, the method further comprising:
    providing a carrier signal with a phase and an amplitude;
    modulating the phase of the carrier signal with the distorted second component when the comparison has produced the first result, or with the second component when the comparison has produced the second result;
    modulating the amplitude of the carrier signal with the first component; and
    amplifying the carrier signal by the at least one amplifier circuit.

4. The method of claim 1, wherein the at least one component in the distortion step comprises the first and the second component, and each of the plurality of predistortion coefficients in the first and in the second table comprises a first and a second coefficient element, the method further comprising:
    providing a carrier signal with a phase and an amplitude;
    modulating the phase of the carrier signal with the distorted second component when the comparison has produced the first result, or with the second component when the comparison has produced the second result;
    modulating the amplitude of the carrier signal with the distorted first component when the comparison has produced the first result, or with the first component when the comparison has produced the second result; and
    amplifying the carrier signal by the at least one amplifier circuit.

5. The method of claim 4,
wherein the distortion step comprises:
    distorting the first component with the first coefficient element and the second component with the second coefficient element when the comparison has produced the first result.

6. The method of claim 1,
wherein selection of a predistortion coefficient comprises:
selecting a predistortion coefficient from the selected table based on the power word that is produced and on the first component when the comparison has produced the first result.

7. The method of claim 1,
wherein selection of a table comprises:
selecting one table from the first and the at least one second table based on the determined operating mode and the first component.

8. The method of claim 1,
wherein selection of a table comprises:
selecting one table from the first and the at least one second table based on the determined operating mode, the first component and the second component.

9. The method claim 1,
wherein the at least one characteristic variable by means of which the first and at least one second operating state are defined comprises a value which is derived from an amplitude and/or a phase of a signal which is emitted from the at least one amplifier circuit.

10. The method of claim 1,
wherein determining the operating state comprises:
outputting one signal element from the signal which is emitted from the at least one amplifier circuit;
determining an envelope of the signal element, with the characteristic variable derived from the envelope;
producing a selection word for selection of one table from the first and at least one second table.

11. The method of claim 1,
wherein determining the operating state comprises:
outputting one signal element from the signal which is emitted from the at least one amplifier circuit;
outputting a signal element of the phase-modulated carrier signal;
forming a phase difference between the output signal elements; and
producing a selection word derived from the phase difference for selection of one table from the first and at least one second table.

12. The method of claim 1,
wherein determining the operating state comprises at least one of:
determining a temperature of the at least one amplifier circuit;
determining a current drawn by the at least one amplifier circuit;
determining a supply voltage for the at least one amplifier circuit;
determining an impedance or an impedance change of the at least one amplifier circuit; and
determining a reflection coefficient at a signal output of the at least one amplifier circuit.

13. The method of claim 1,
wherein determining the operating state comprises:
providing a local oscillator signal;
outputting a signal element from the amplified signal which is emitted from the at least one amplifier circuit;
frequency converting the signal element using the local oscillator signal;
subdividing the frequency-converted signal element into a third component and a fourth component;
producing a selection word from the third component and from the fourth component for selection of one table from the first and the at least one second table.

14. The method of claim 1,
wherein providing the discrete-value and discrete-time modulation signal comprises:
providing an in-phase component and a quadrature component;
producing the first component by forming the square of the magnitude of the in-phase component and of the quadrature component;
producing the second component from the in-phase component and the quadrature component.

15. The method of claims 1,
wherein producing the power word comprises:
determining a nominal power of the amplified carrier signal to be emitted during a time period;
determining a maximum of the first component during the time period;
producing the power word from the nominal power to be emitted and from the maximum of the first component.

16. The method of claim 1,
wherein producing the first or the second result comprises one and only one of:
producing the first result when the comparison shows that a value of the first component exceeds the reference value, and of the second result when the amplitude of the first component does not exceed the reference value; or
producing the first result when the comparison shows that a value of the first component does not exceed the reference value, and of the second result when the amplitude of the first component exceeds the reference value.

17. The method of claim 1,
wherein providing the first and the at least one second table comprises:
providing a memory with a plurality of first addressable memory locations and with a plurality of second addressable memory locations;
storing the predistortion coefficients from the first table in the first addressable memory locations; and
storing the predistortion coefficients from the second table in the second addressable memory locations.

18. The method of claim 1,
wherein selecting one table is performed only when the comparison of the power word with the reference value has produced the first result.

19. The method of claim 1,
wherein selecting one table and selecting a predistortion coefficient comprise:
associating addresses with the predistortion coefficients;
forming a first address part by evaluation of the determined operating mode;
forming a second address part with scaling of the first component by a factor which is derived from the power word;
combining the first and the second address part to form an address; and
determining the predistortion coefficient associated with the address that has been formed.

20. A transmitting device, comprising:
a signal processing device configured to produce and emit a discrete-value and discrete-time modulation signal with a first component and a second component, and configured to emit a power control signal based on the first component at a control output thereof;
an amplifier circuit configured to assume one operating state from a set of a first operating state and at least one second operating state, with the first operating state and the at least one second operating state being characterized by at least one characteristic variable;

a predistortion device comprising:

a control input and a selection input;

a first signal path configured to pass the first and second components of the modulation signal;

a memory comprising a plurality of predistortion coefficients stored therein, in which a first number of predistortion coefficients are associated with the first operating state of the amplifier circuit, and in which at least one second number of predistortion coefficients are associated with the at least one second operating state;

an address unit configured to select the first or second number of predistortion coefficients depending on a selection word, which is derived from the at least one characteristic variable at the selection input;

a second signal path comprising switching elements for distortion of at least one component applied thereto with a predistortion coefficient from the selected number of predistortion coefficients depending on a control signal provided at the control input and the component;

wherein the predistortion device is configured to select the first or second signal path depending on the signal which is provided to the control input;

a modulation unit coupled to the output of the predistortion unit, and configured to convert signals provided by the predistortion device to a carrier signal, and emit the carrier signal at an output thereof which is coupled to the amplifier circuit;

a power control unit connected to the signal processing device, the power control unit configured to emit the control signal for predistortion and emit a gain adjustment signal from the power control signal.

21. The transmitting device of claim 20, further comprising means for recording the at least one characteristic variable, and configured to produce and emit the selection word to the predistortion device.

22. The transmitting device of claim 21, wherein the means is configured to record at least one of the following characteristic variables, a temperature of the amplifier circuit;

a current drawn by the amplifier circuit;

a supply voltage of the amplifier circuit;

an impedance or an impedance change of the amplifier circuit;

a reflection coefficient at a signal output of the amplifier circuit; and a phase and/or an amplitude of an output signal from the amplifier circuit.

23. The transmitting device of claim 21, wherein the means for recording comprises:

a directional coupler coupled to an output of the amplifier circuit and configured to emit a signal element from a signal emitted from the amplifier circuit; and wherein the means for recording further comprises at least one of the following elements:

an envelope curve detector connected to the directional coupler and configured to emit a signal to the selection input of the predistortion device;

a phase detector coupled to the directional coupler and the modulation unit, and configured to emit a signal to the selection input of the predistortion unit.

24. The transmitting device of claim 21, wherein the means for recording comprises:

a demodulation unit coupled to the output of the amplifier circuit and configured to convert a signal emitted from the amplifier circuit to a third component and a fourth component, with one output of the demodulation unit coupled to the selection input of the predistortion unit.

25. The transmitting device of claim 20, wherein a first address part is associated with each number of predistortion coefficients in the memory for the predistortion unit, and a second address part is associated with each predistortion coefficient in each number of predistortion coefficients, and wherein the address unit is configured to determine the first address part.

26. The transmitting device of claim 20, wherein the predistortion device comprises an addressing unit with a scalar multiplication unit configured to multiply the first component by a factor derived from the control signal applied to the control input.

27. The transmitting device of claim 20, wherein the switching elements in the second signal path comprise a scalar multiplication unit or an addition unit, wherein the scalar multiplication unit is configured to multiply the first component by the predistortion coefficient, and the addition unit is configured to add the second component to the predistortion coefficient.

28. The transmitting device of claim 20, wherein the modulation unit comprises a phase locked loop comprising frequency divider with an adjustment input for adjustment of a division ratio associated therewith in its feed back path, and wherein an adjustment input for adjustment of the division ratio is connected to an output of the modulation unit.

* * * * *